(12) United States Patent
Sakagami

(10) Patent No.: US 7,763,929 B2
(45) Date of Patent: Jul. 27, 2010

(54) NONVOLATILE SEMICONDUCTOR MEMORY DEVICE COMPRISING SHIELD ELECTRODE ON SOURCE AND METHOD FOR MANUFACTURING THE SAME

(75) Inventor: Eiji Sakagami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 11/618,336

(22) Filed: Dec. 29, 2006

(65) Prior Publication Data

US 2007/0164341 A1    Jul. 19, 2007

(30) Foreign Application Priority Data

Jan. 17, 2006    (JP) .............................. 2006-009165

(51) Int. Cl.
*H01L 29/788* (2006.01)
*H01L 29/792* (2006.01)

(52) U.S. Cl. .................. 257/315; 257/314; 257/316; 257/340; 257/E29.3; 257/E29.123; 365/185.02

(58) Field of Classification Search ................ 257/261, 257/314–316, 340, E29.3
See application file for complete search history.

(56) References Cited

U.S. PATENT DOCUMENTS 5,282,160 A * 1/1994 Yamagata .............. 365/185.05

| 6,056,783 A | * | 5/2000 | Yoo et al. | ..................... 716/1 |
|---|---|---|---|---|
| 6,509,222 B1 | * | 1/2003 | Grossi et al. | ................ 438/201 |
| 6,759,709 B1 | * | 7/2004 | Shimizu | ..................... 257/315 |
| 2005/0180186 A1 | * | 8/2005 | Lutze et al. | .................. 365/53 |

FOREIGN PATENT DOCUMENTS

| JP | 2003-188287 | | 7/2003 |
|---|---|---|---|
| JP | 2003188287 | * | 7/2003 |

* cited by examiner

*Primary Examiner*—Lynne A Gurley
*Assistant Examiner*—Jesse Y Miyoshi
(74) *Attorney, Agent, or Firm*—Hogan Lovells US LLP

(57) ABSTRACT

A nonvolatile semiconductor memory device includes floating gates, source areas, drain areas, word lines, diffusion layers, source lines and shield wires. The source area is shared by the floating gates adjacent to each other in a column direction. The drain area faces the source area in the column direction with the floating gate. The drain area is wider than the source area in the column direction. The diffusion layer is formed on an inner wall of a trench made between the source areas adjacent to each other in the same row direction and electrically connects the adjacent source areas together. The source line is formed of the source area and diffusion layer on the same row. The shield wire is disposed on and along the source line. A top surface of the shield wire is lower than that of the floating gate adjacent to the shield wire.

12 Claims, 22 Drawing Sheets

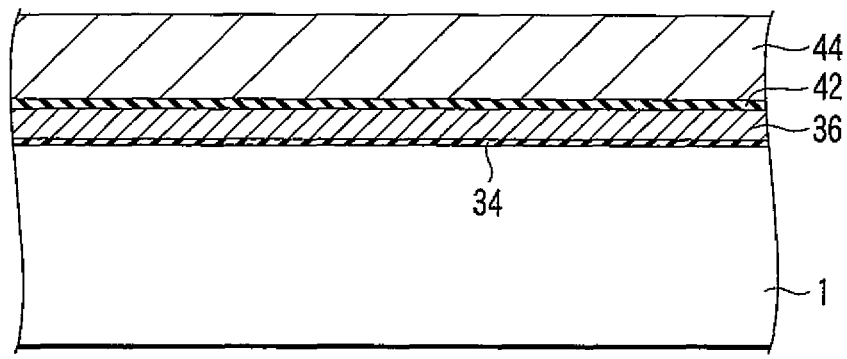
F I G. 5A
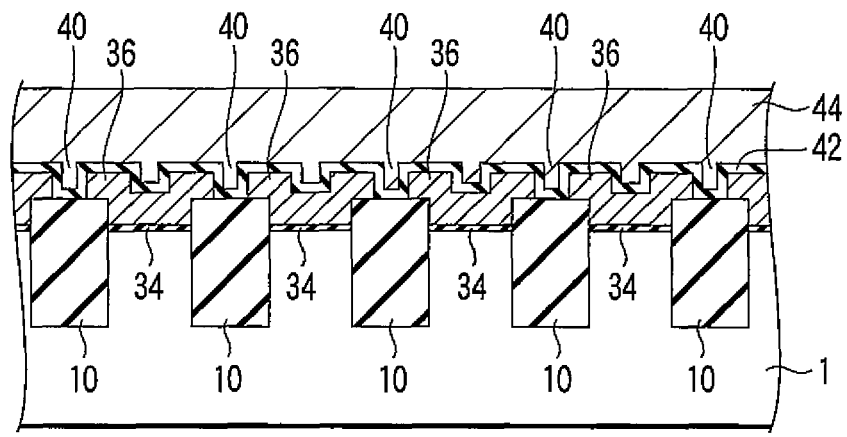
F I G. 5B
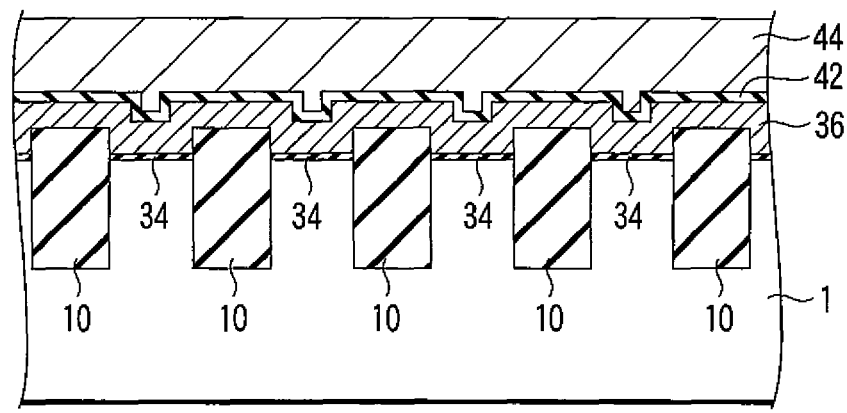
F I G. 5C

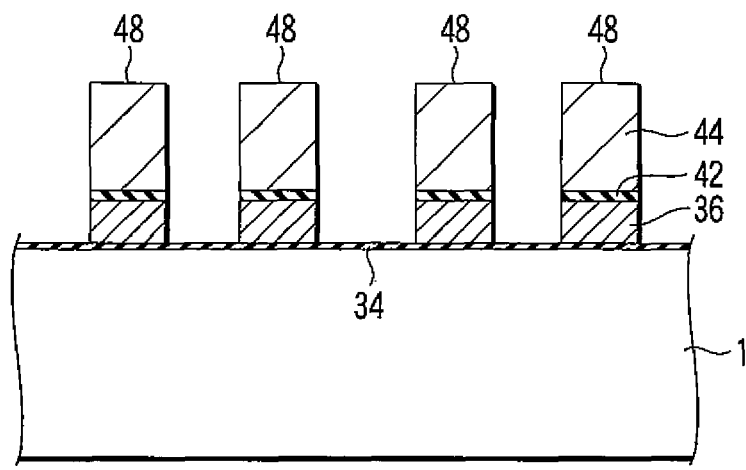
F I G. 7A
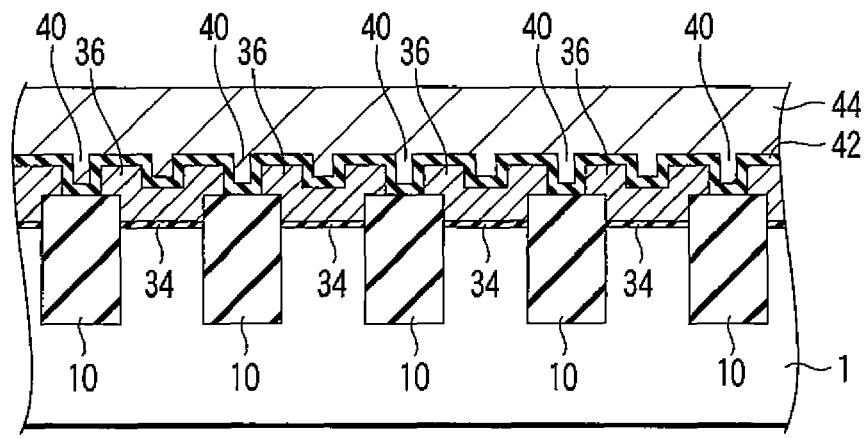
F I G. 7B
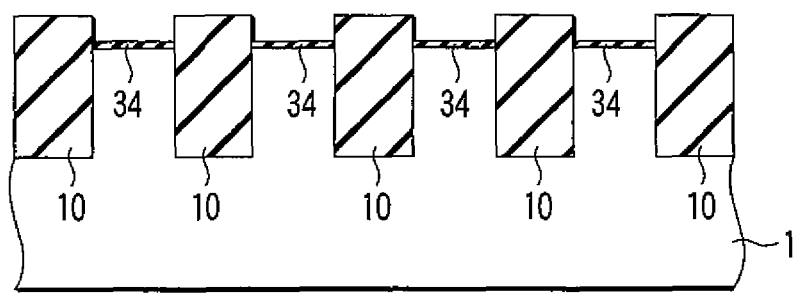
F I G. 7C

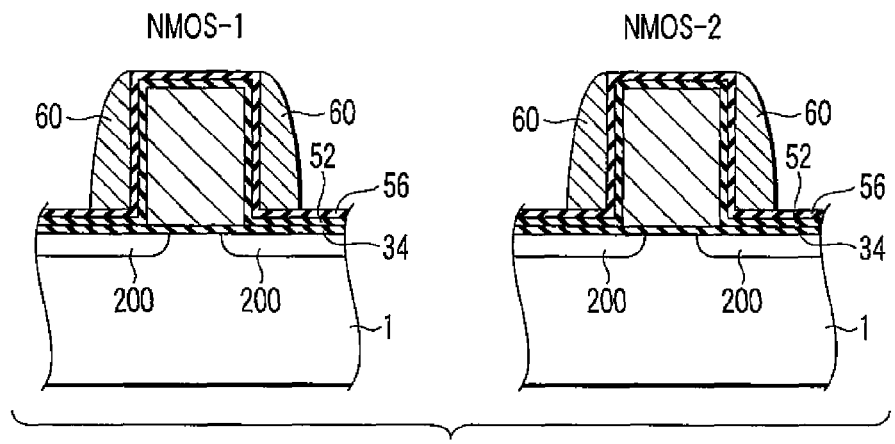
F I G. 24
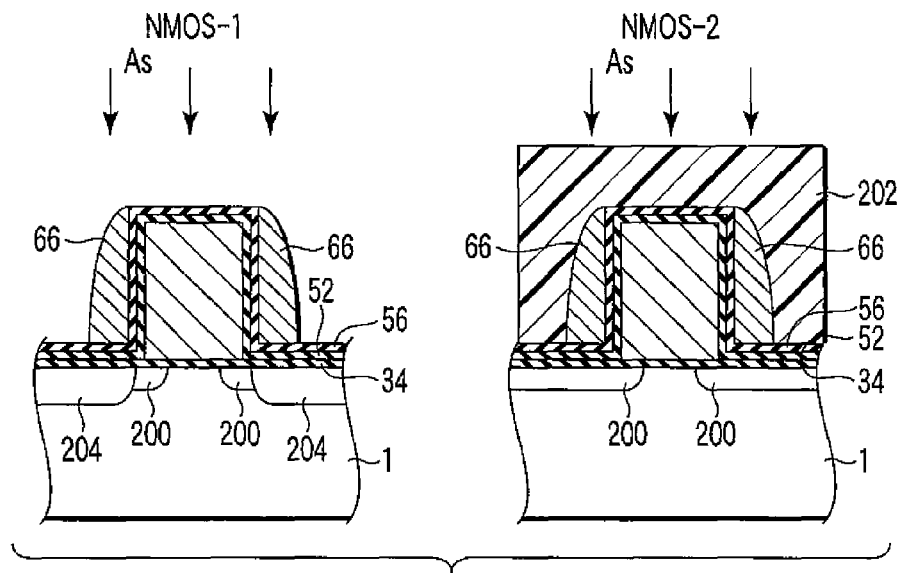
F I G. 25
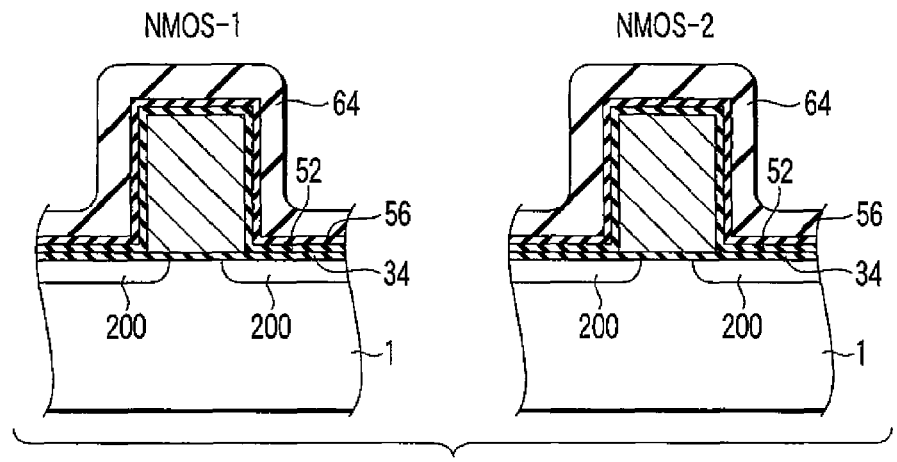
F I G. 26

NONVOLATILE SEMICONDUCTOR MEMORY DEVICE COMPRISING SHIELD ELECTRODE ON SOURCE AND METHOD FOR MANUFACTURING THE SAME

CROSS-REFERENCE TO RELATED APPLICATIONS

This application is based upon and claims the benefit of priority from prior Japanese Patent Application No. 2006-009165, filed Jan. 17, 2006, the entire contents of which are incorporated herein by reference.

BACKGROUND OF THE INVENTION

1. Field of the Invention

The present invention relates to a nonvolatile semiconductor memory device and a method for fabricating the nonvolatile semiconductor memory device, and in particular, to a NOR-type nonvolatile semiconductor memory device and a method for fabricating the NOR-type nonvolatile semiconductor memory device.

2. Description of the Related Art

Recently known nonvolatile semiconductor memory devices include memory cells of a gate structure in which a floating gate and a control gate are stacked to enable data to be electrically rewritten. With a reduction in the size of the memory cells in these nonvolatile semiconductor memory devices, the magnitude of capacitive coupling between adjacent floating gates tends to increase. This disadvantageously varies a threshold voltage for the memory cells. To solve this problem, for example, Jpn. Pat. Appln. KOKAI Publication No. 2003-188287 proposes, for example, a nonvolatile semiconductor memory device having a shield electrode between the memory cells to reduce the capacitive coupling between the floating gates.

In the nonvolatile semiconductor memory device disclosed in Jpn. Pat. Appln. KOKAI Publication No. 2003-188287, a single crystal silicon layer functioning as the shield electrode is formed on a source diffusion layer and a drain diffusion layer. The shield electrode is located as high as the floating gate. This structure effectively enables an increase in the distance between a word line (control gate) formed on the floating gate and the shield electrode. As a result, even if a high voltage is applied to between the word line and the shield electrode during data erasure, field intensity can be reduced. This makes it possible to inhibit the dielectric breakdown of an insulating film provided between the word line and the shield electrode.

On the other hand, the following problems may be involved in the formation of a shield electrode based on the epitaxial growth of a silicon layer on the source diffusion layer and drain diffusion layer. The reduced size of the area in which silicon is to be epitaxially grown frequently results in improper growth, which may cause the shield electrode to be inappropriately shaped, or inappropriate impurity diffusion, which may increase resistance. This prevents the shield electrode from exerting a sufficient shield effect. As a result, increasingly miniaturized semiconductor memory devices have made it difficult to suppress the capacitive coupling between the adjacent floating gates under the shield effect to inhibit a variation in threshold voltage.

The above problem occurs particularly frequently in NOR-type nonvolatile semiconductor memory devices employing a self-aligned-source (SAS) structure for a source area. The SAS structure enables the space between the memory cells sandwiching the source area between them to be minimized. However, this structure involves the formation of grooves, which results in high steps in a layer under the shield electrodes. Thus, an attempt to grow a silicon layer for the shield electrode on the source diffusion layer by a conventional method may lead to further improper growth owing to the step shape of the underlying silicon substrate. This may disadvantageously prevent the shield electrode from being appropriately formed.

BRIEF SUMMARY OF THE INVENTION

A nonvolatile semiconductor memory device according to an aspect of the present invention includes:

floating gates arranged on a semiconductor substrate in a matrix;

source areas formed in a surface of the semiconductor substrate and each of which is shared by the floating gates adjacent to each other in a column direction;

drain areas formed in the surface of the semiconductor substrate and each of which face the source area in the column direction with the floating gate interposed therebetween, the drain area being wider than the source area in the column direction;

word lines each of which is continuously formed on the floating gates arranged in the same row direction;

bit lines each of which is electrically connected to the drain area via a drain contact and provided on the word lines in the column direction with an interlayer insulating film interposed therebetween;

diffusion layers each of which is formed on an inner wall portion of a trench made between the source areas adjacent to each other in the same row direction and electrically connects the adjacent source areas together;

source lines each of which is formed of the source area and diffusion layer on the same row; and shield wires each of which is disposed on and along the source line, a top surface of the shield wire being lower than that of the floating gate adjacent to the shield wire.

A method for fabricating a nonvolatile semiconductor memory device according to an aspect of the present invention includes:

forming floating gates of a memory cell on a semiconductor substrate in a matrix;

forming word lines on the floating gates arranged in the same row direction;

making trenches in the semiconductor substrate so that each trench is located between areas in which source areas of the memory cell which are adjacent to each other in the row direction are to be formed;

forming the source areas in a surface of the semiconductor substrate so that each of the source areas is shared by the floating gates adjacent to each other in a column direction;

forming drain areas in the surface of the semiconductor substrate so that each of the drain areas is adjacent to the source area with the floating gate interposed therebetween in the column direction and is wider than the source area in the column direction;

forming diffusion layers on inner wall portions of the trenches along the row direction so as to connect the source areas adjacent to each other in the same row direction, so that the source area and the diffusion layer form a source line;

forming a shield wire on each of the source lines, a top surface of the shield wire being lower than that of the floating gate adjacent to the shield wire; and forming bit lines in the column direction, each of the bit lines being electrically connected to the drain area via a drain contact.

BRIEF DESCRIPTION OF THE SEVERAL VIEWS OF THE DRAWING

FIGS. 5A to 5C are sectional views which show a third step of fabricating the NOR-type nonvolatile semiconductor memory device shown in FIG. 1 and which correspond to directions along lines A-A, B-B, and C-C in FIG. 1;

FIGS. 7A to 7C are sectional views which show a fifth step of fabricating the NOR-type nonvolatile semiconductor memory device shown in FIG. 1 and which correspond to directions along lines A-A, B-B, and C-C in FIG. 1;

FIG. 24 is a sectional view showing a second step of fabricating the peripheral transistor shown in FIG. 2;

FIG. 25 is a sectional view showing a third step of fabricating the peripheral transistor shown in FIG. 2;

FIG. 26 is a sectional view showing a fourth step of fabricating the peripheral transistor shown in FIG. 2;

DETAILED DESCRIPTION OF THE INVENTION

With reference to the drawings, description will be given of a nonvolatile semiconductor memory device according to a first embodiment of the present invention and a method for fabricating the nonvolatile semiconductor memory device. Specifically, the first embodiment of the present invention is a NOR-type nonvolatile semiconductor memory device that adopts, for example, a self-aligned-source (SAS) structure in order to reduce memory cell size, and a method for fabricating the nonvolatile semiconductor memory device.

Figure 1:
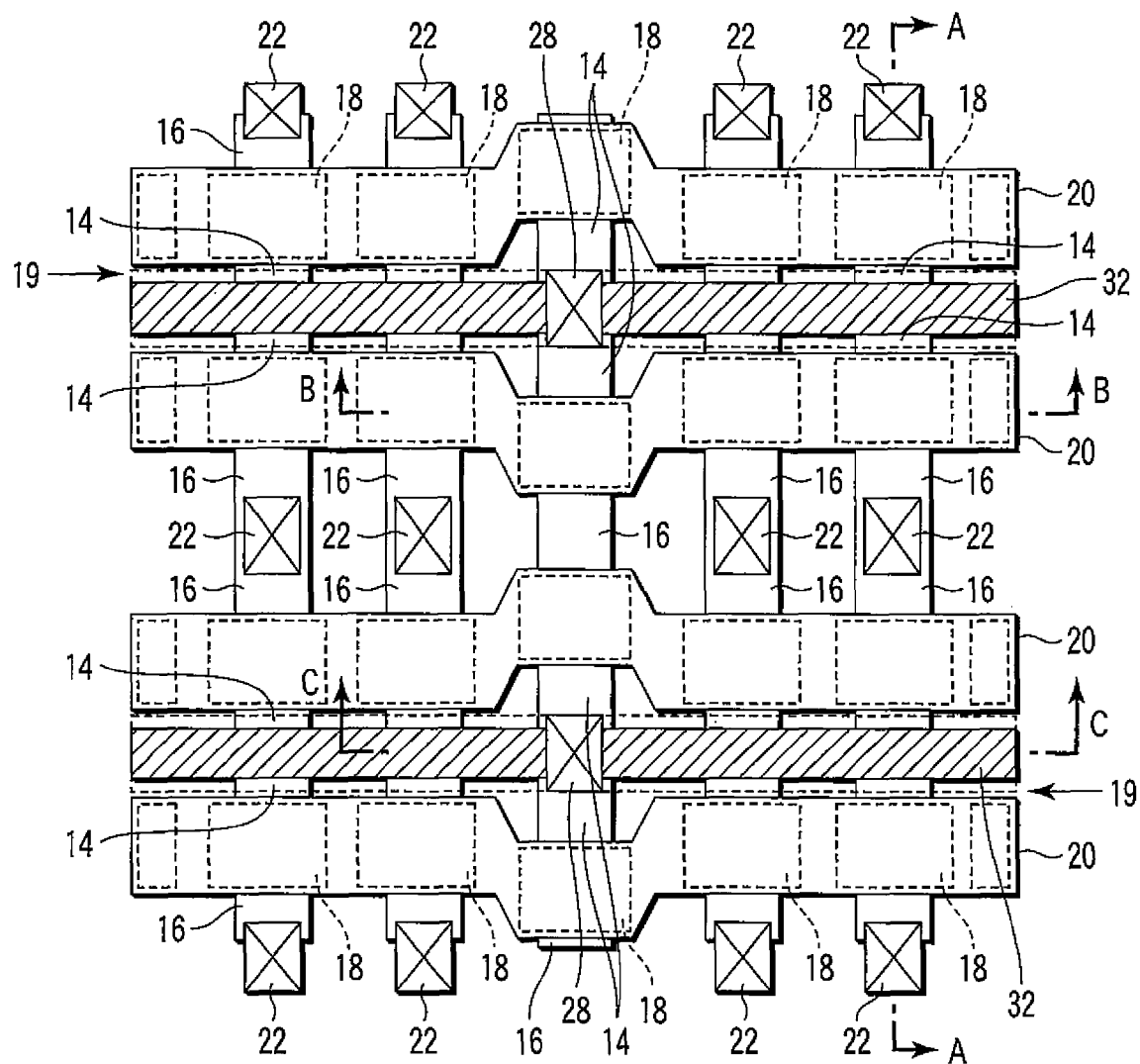
FIG. 1 is a plan view showing a memory cell array comprising a NOR-type nonvolatile semiconductor memory device according to a first embodiment of the present invention.
Figure 2A:
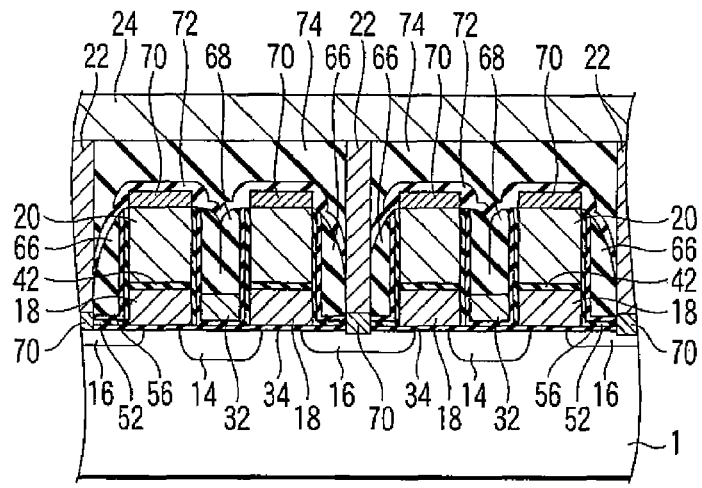
FIGS. 2A to 2C are diagrams which show main cross sections of the memory cell array shown in FIG. 1 and which are sectional views taken along lines A-A, B-B, and C-C in FIG. 1.
Figure 2B:
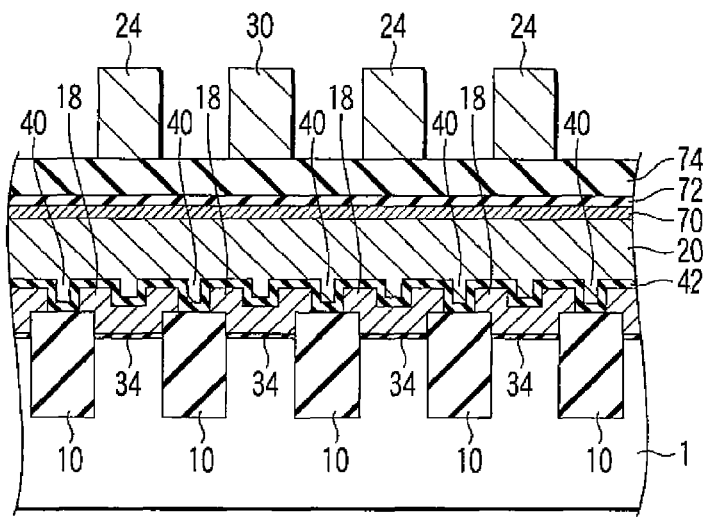
Figure 2C:
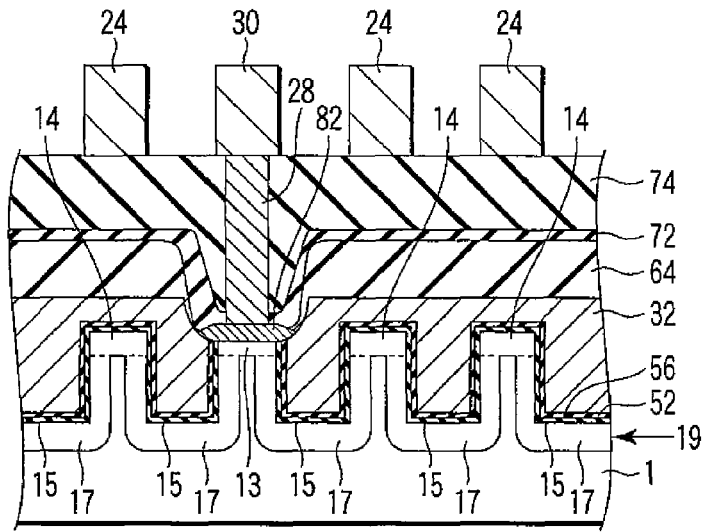

FIG. 1 is a plan view showing a memory cell array of a NOR-type nonvolatile semiconductor memory device according to a first embodiment of the present invention. FIG. 2A is a sectional view taken along line A-A in the memory cell array in FIG. 1. FIG. 2B is a sectional view taken along line B-B in the memory cell array in FIG. 1. FIG. 2C is a sectional view taken along line C-C in the memory cell array in FIG. 1.

As shown in FIGS. 1 and 2A to 2C, in the NOR-type nonvolatile semiconductor memory device according to the first embodiment of the present invention, floating gates (charge accumulation layer) 18 are arranged on a semiconductor substrate 1 in a matrix. Source areas 14 are formed in a surface of the semiconductor substrate 1. The source areas 14 are each shared by the floating gates 18 adjacent to each other in a column direction. The SAS structure allows the omission of source contacts to be individually provided for the respective source areas 14. This enables a reduction in the space between memory cells on the source area.

Drain areas 16 are further formed in the surface of the semiconductor substrate 1. The drain areas 16 are each adjacent to the source area 14 via the floating gate 18 in the column direction. Owing to the need to provide a drain contact on the drain area 16, the drain contact 16 is formed to be wider than the source area 14 in the column direction.

Trenches 15 are each formed between the source areas 14 adjacent to each other in the same row direction. On the floating gates 18 arranged in the same row direction, a word line (control gate electrode) 20 shared by these floating gates 18 is formed with an inter-gate insulating film interposed between the floating gate and the word line. The inter-gate insulating film is formed using an ONO film (silicon oxide film/silicon nitride film/silicon oxide film) 42 or the like as a material. Diffusion layers 17 are each provided on an inner wall portion of the trench 15 along the row direction. The diffusion layers 17 electrically connect the source areas 14 adjacent to each other in the same row direction. The diffusion layers 17 and source areas 14 arranged in the same row direction form a source line 19.

Bit lines 24 are electrically connected commonly with the drain areas 16 via the drain contacts 22. The bit line 24 is formed on the word lines 20 in the column direction with an interlayer insulating film 74 interposed therebetween.

Shield wires 32 are each formed on and along the source line 19. The shield wires 32 are also formed inside the trenches 15 so as to extend continuously along the row direction. The shield wires 32 each have a top surface having a smaller height than that of top surface of the floating gate 18. That is, the top surface of the shield wire 32 is present lower than that of the floating gate 18.

Metal source lines 30 are located substantially parallel to the bit line. The metal source lines 30 are each intermittently electrically connected to both the source line 19 and the shield wire 32 via a conductive material 82 and a source contact 28 in the column direction; the shield wire 32 is placed on the source line 19 with a post-oxidation film 52 and a tetraethylorthosilicate (TEOS)-containing oxide film 56 interposed between the source line 19 and the shield wire 32. This enables the inhibition of dielectric breakdown of an insulating film (post-oxidation film 52 and TEOS-containing oxide film 56) provided between the word line 20 and the shield wire 32. Further, the capacitive coupling between the adjacent floating gates 18 can be sufficiently reduced. The metal source line 30 is placed on the interlayer insulating film 74 parallel to the bit line 24.

As shown in FIG. 2A, the memory cell interval between the source areas 14 is smaller than the memory cell interval between the drain areas 16. Consequently, the magnitude of the capacitive coupling between the floating gates adjacent to each other via the source areas 14 in the column direction is greater than that between the floating gates adjacent to each other via the drain areas 16 in the column direction. This capacitive coupling is a major factor that varies a threshold voltage for the memory cell transistors.

As shown in FIG. 2B, the conductive word line 20 is partly buried in cell slits 40 on element isolation regions 10. The cell slits 40 are intervals formed to electrically separate the floating gate of the respective memory cells from one another. A shield effect exerted by the cell slits 40 thus enables a sharp reduction in the capacitive coupling between the floating gates adjacent to each other in row direction.

A shield polysilicon wire 32 is formed lower than the top surface of the floating gate. More specifically, the closest distance between the word line 20 and the shield polysilicon wire 32 is desirably equal to or greater than the sum of the thickness of the ONO film 42 and the thickness of a tunnel oxide film 34. In other words, the top surface of the shield polysilicon wire 32 is desirably lower than that of the floating gate 18 by the value of thickness of the tunnel oxide film. This is because the increased distance between the shield polysilicon wire 32 and the word line 20 makes it possible to inhibit the dielectric breakdown of the insulating film (post-oxidation film 52 and TEOS-containing oxide film 56) provided between the word line 20 and the shield wire 32. It is also possible to sufficiently reduce the capacitive coupling between the floating gates 18 adjacent to each other via the source area 14. Further, the potential of the shield polysilicon wire 32 is effectively prevented from being raised by the higher potential of the word line 20.

As shown in FIG. 2C, the shield polysilicon wire 32 is also buried in the trenches 15 arranged on the source area side in the same row direction. As a result, the volume of the shield polysilicon wire 32 per a set of two floating gates 18 adjacent to each other in the column direction via the source line 19 is greater than in the case of the conventional technique disclosed in, for example, Jpn. Pat. Appln. KOKAKI Publication No. 2003-188287. In other word, a cross sectional area, in which a current is flowing in the shield polysilicon wire 32, is substantially larger than that of the conventional structure. This enables the resistance of the shield wire 32 to be sufficiently reduced. As a result, the original shield effect, resulting in an equal potential, makes it possible to further reduce the capacitive coupling between the floating gates 18 and to inhibit a variation in the threshold voltage for the memory cell transistors.

Now, the operation of each memory cell will be described with reference to FIG. 2A. First, a write operation will be described. For a data write operation, for example, 10V is applied to the word line 20 and 5V is applied to the drain area 16, with the source area 14 set equal to ground potential (0V). This application condition allows electrons to flow from the source area 14 to the drain area 16. The electrons are accelerated by the potential difference between the source area 14 and the drain area 16. Some of the electrons become hot electrons, which are then captured by the floating gate 18.

Now, an erase operation will be described. For data erasure, for example, −8V is applied to the word line 20 and 10V is applied to the substrate 1. As a result, a Fowler-Nordheim (FN) current draws electrons captured by the floating gate 18 to the substrate 1. This erase operation is executed on each unit block of the memory cell array.

Finally, a read operation will be described. For a data read operation, for example, 5V is applied to the word line 20 and 0.8V is applied to the drain area 16, with the source area 14 set equal to ground potential (0V). Under this application condition, determination is made depending on whether or not the memory cell is conductive. That is, memory cells with the floating gate 18 having captured electrons are non-conductive. Memory cells with the floating gate 18 not having captured any electrons are conductive.

Now, with reference to FIGS. 3A and 3B to FIGS. 17A to 17C, description will be given of a method for manufacturing a NOR-type nonvolatile semiconductor memory device according to the first embodiment of the present invention. FIGS. 3A to 17A are process diagrams of a section of the memory cell array in FIG. 1 taken along line A-A. FIGS. 3B to 17B are process diagrams of a section of the memory cell array in FIG. 1 taken along line B-B. FIGS. 3C to 17C are process diagrams of a section of the memory cell array in FIG. 1 taken along line C-C. The manufacturing method will be described focusing on the cross section taken along line A-A.

In this description, the shield polysilicon wire is used as a shield wire, and nickel silicide (NiSi) is used as a conductive member.

Figure 3A:
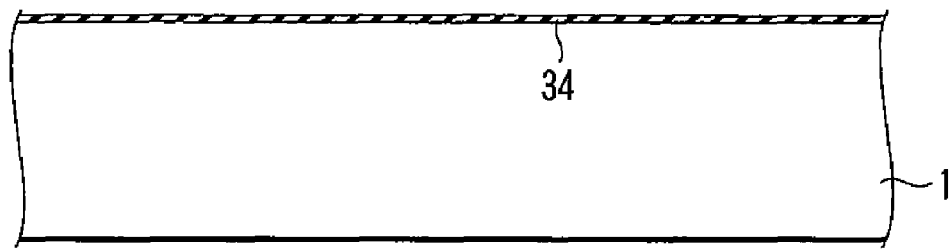
FIGS. 3A to 3C are sectional views which show a first step of fabricating the NOR-type nonvolatile semiconductor memory device shown in FIG. 1 and which correspond to directions along lines A-A, B-B, and C-C in FIG. 1.
Figure 3B:
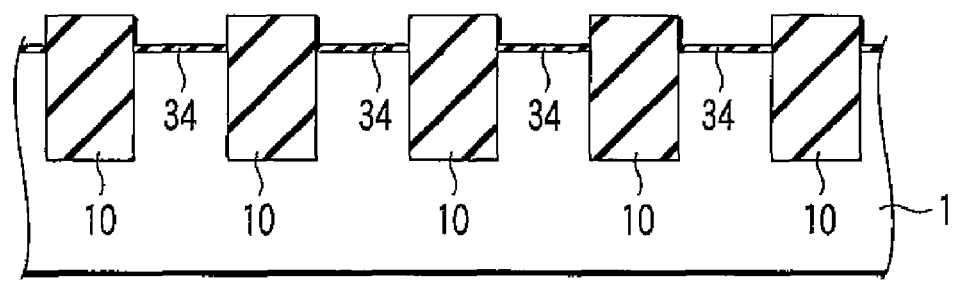
Figure 3C:
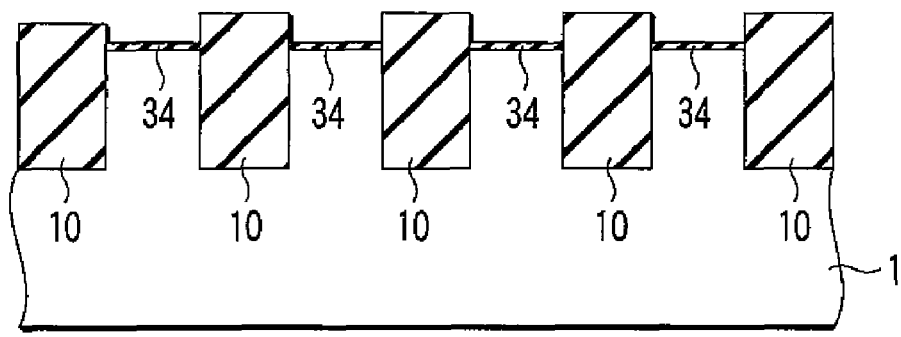

First, as shown in FIGS. 3A to 3C, trenches that separate memory cells from one another are formed in the semiconductor substrate 1 using, for example, the shallow trench isolation (STI) technique. A silicon oxide film is then buried in the trenches to form element isolation regions 10. Well regions (not shown) are subsequently formed in the substrate 1 by a diffusion process. The semiconductor substrate is subsequently thermally oxidized to form a tunnel oxide film 34 on a surface of the substrate to a film thickness of, for example, 10 nm.

Figure 4A:
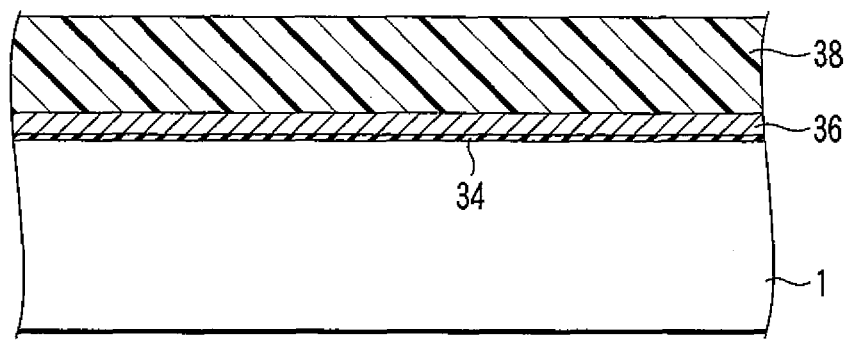
FIGS. 4A to 4C are sectional views which show a second step of fabricating the NOR-type nonvolatile semiconductor memory device shown in FIG. 1 and which correspond to directions along lines A-A, B-B, and C-C in FIG. 1.
Figure 4B:
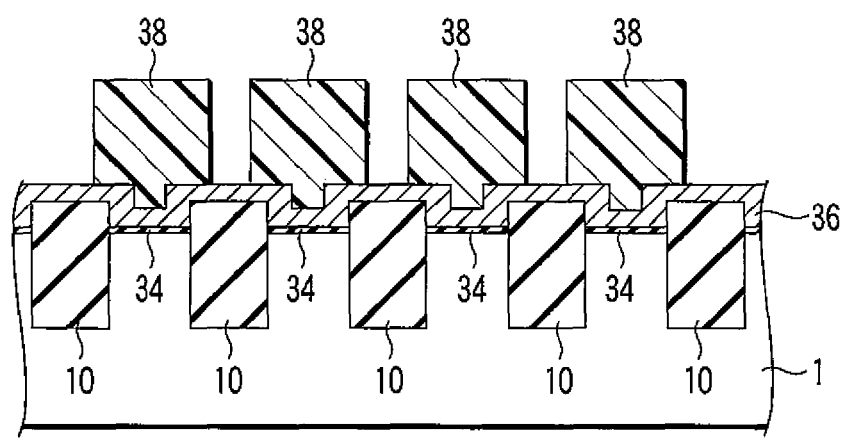
Figure 4C:
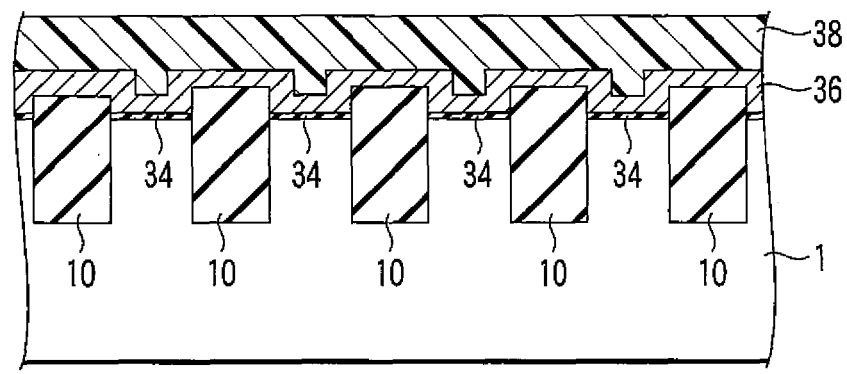

Then, as shown in FIGS. 4A to 4C, phosphorous-doped polysilicon 36 is deposited on the surface of the substrate. A photoresist is subsequently coated on the substrate surface and patterned to form a photoresist mask 38.

Then, as shown in FIGS. 5A to 5C, a dry etching process using the photoresist mask 38 is executed to form cell slits 40 in the polysilicon 36. Then, photoresist mask 38 is removed, and an ONO film 42 is deposited which forms an inter-gate insulating film between the floating gate and the control gate (word line). A phosphorous-doped polysilicon 44 functioning as the control gate, that is, the word line, is subsequently formed on the ONO film 42 to a thickness of, for example, 250 nm by the chemical vapor deposition (CVD) process.

Figure 6A:
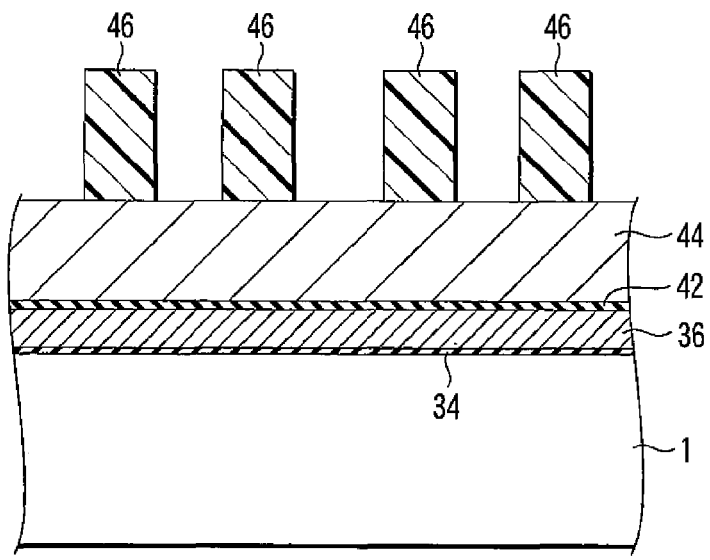
FIGS. 6A to 6C are sectional views which show a fourth step of fabricating the NOR-type nonvolatile semiconductor memory device shown in FIG. 1 and which correspond to directions along lines A-A, B-B, and C-C in FIG. 1.
Figure 6B:
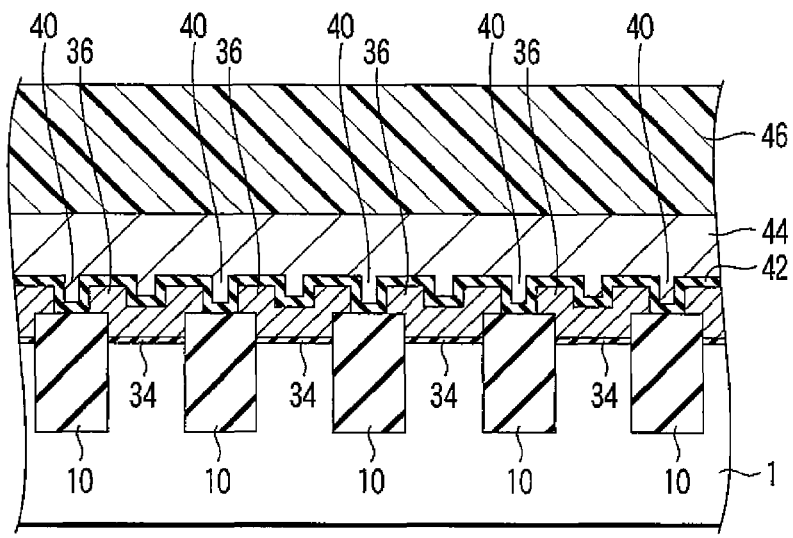
Figure 6C:
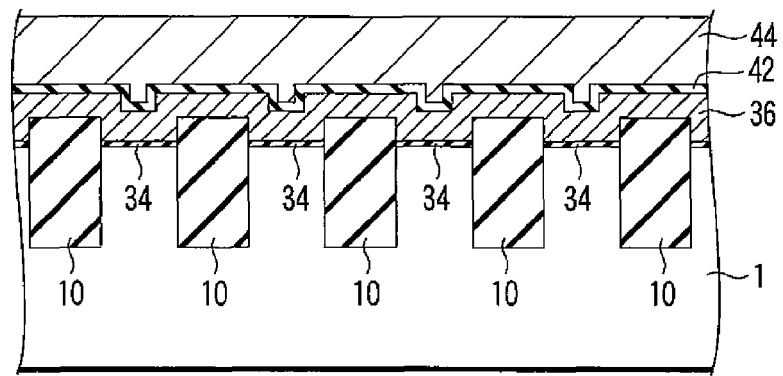

Then, as shown in FIGS. 6A to 6C, a photoresist is coated on the substrate surface, and the memory cell gate is then patterned to form a photoresist mask 46.

Then, as shown in FIGS. 7A to 7C, a dry etching process using the photoresist mask 46 is executed to sequentially etch the polysilicon 44, ONO insulating film 42, and polysilicon 36. Gates 48 including a stacked structure are thus formed. Here, the space between the gates 48 adjacent to each other in the column direction is formed to be narrower on the source area side than on the drain area side. This allows a shield polysilicon wire to be selectively formed on the source area side (This will be described below in detail in conjunction with the subsequent step). The photoresist mask 46 is subsequently removed.

Figure 8A:
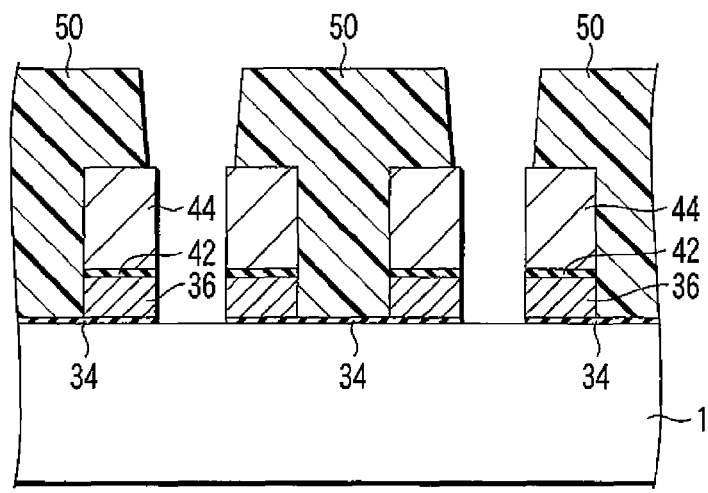
FIGS. 8A to 8C are sectional views which show a sixth step of fabricating the NOR-type nonvolatile semiconductor memory device shown in FIG. 1 and which correspond to directions along lines A-A, B-B, and C-C in FIG. 1.
Figure 8B:
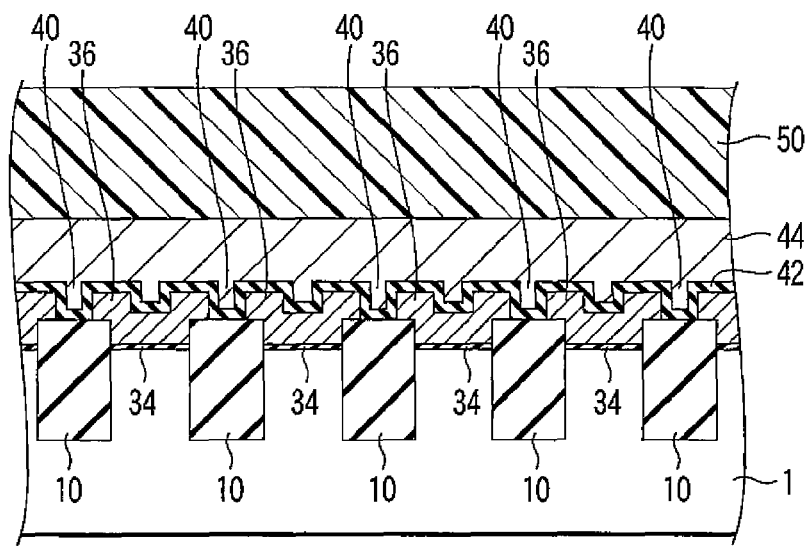
Figure 8C:
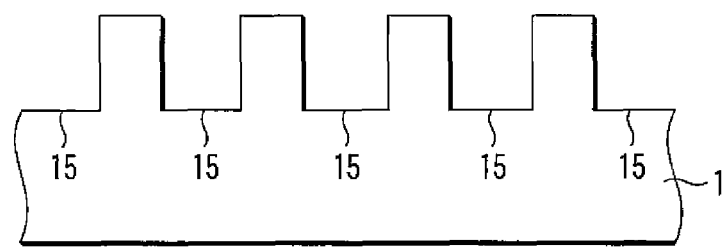

Now, as shown in FIGS. 8A to 8C, a photoresist is coated on the substrate surface and then patterned so as to form openings on the source area side along the same row direction to form a photoresist mask 50. Then, as shown particularly in FIG. 8C, a dry etching process using the photoresist mask 50 is executed to remove silicon oxide film from inside the trenches 15, arranged on the source area side along the row direction. The dry etching selection ratio of the silicon oxide film to silicon (including polysilicon) is several tens or more. Accordingly, even if silicon (including polysilicon) is exposed from the surface when the silicon oxide film is removed by dry etching, almost no silicon is etched. The photoresist mask 50 is subsequently removed.

Figure 9A:
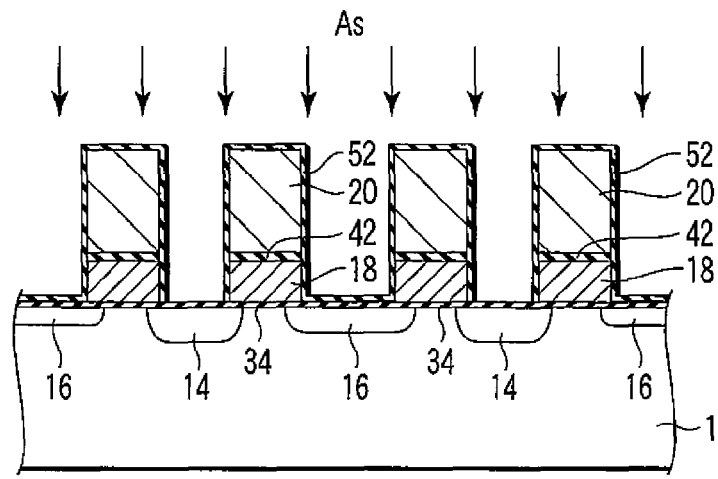
FIGS. 9A to 9C are sectional views which show a seventh step of fabricating the NOR-type nonvolatile semiconductor memory device shown in FIG. 1 and which correspond to directions along lines A-A, B-B, and C-C in FIG. 1.
Figure 9B:
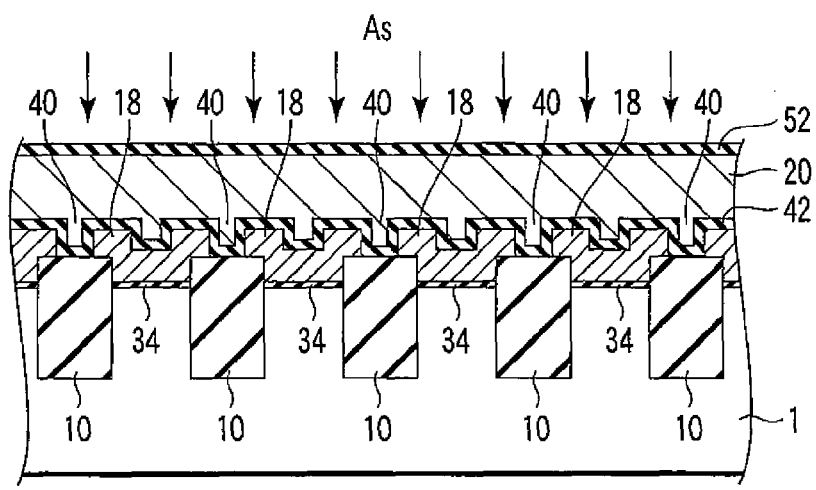
Figure 9C:
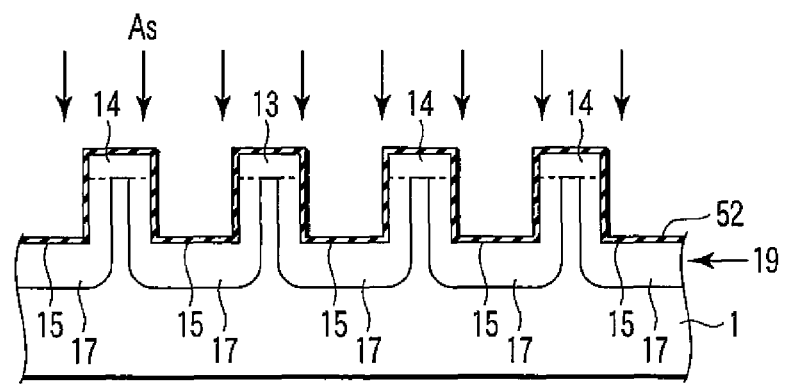

Then, as shown in FIGS. 9A to 9C, the substrate surface is thermally oxidized to form a post-oxidation film 52. As ions are subsequently implanted using the gates as a mask. As a result, the source area 14 and drain area 16 of the memory cell are formed in a self-aligned manner. At this time, as shown in FIG. 9C, a diffusion layer 17 is formed in a surface exposed by removing the silicon oxide film from inside the trenches 15. This enables the source areas of the memory cells arranged in the row direction to be electrically connected together. Thus, the source areas 14 are electrically connected together via the diffusion layer 17 and thus integrated to form a source line 19. This is what is called an SAS structure with the size of the space between the memory cells on the source area reduced. Here, a common source area 13 connects the source line 19 to a source contact (described later). At the same time, As ions are implanted in the word line 20 to further reduce the resistance of the word line 20.

Figure 10A:
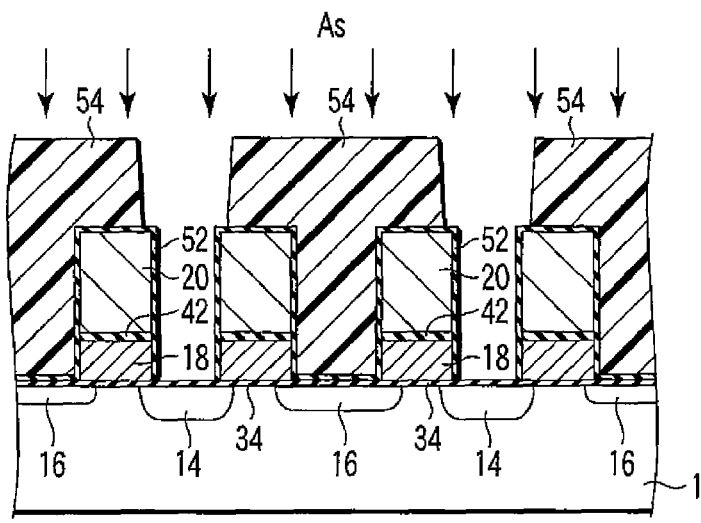
FIGS. 10A to 10C are sectional views which show an eighth step of fabricating the NOR-type nonvolatile semiconductor memory device shown in FIG. 1 and which correspond to directions along lines A-A, B-B, and C-C in FIG. 1.
Figure 10B:
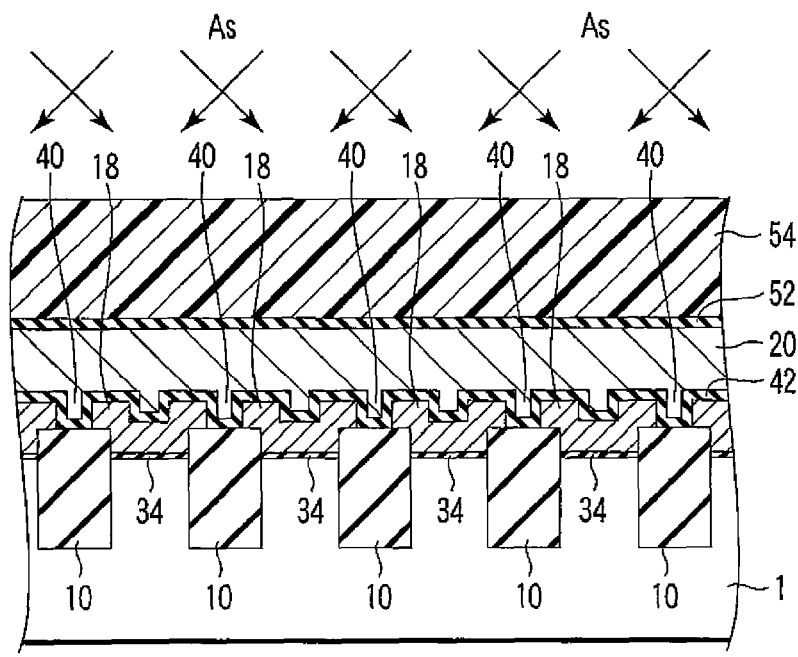
Figure 10C:
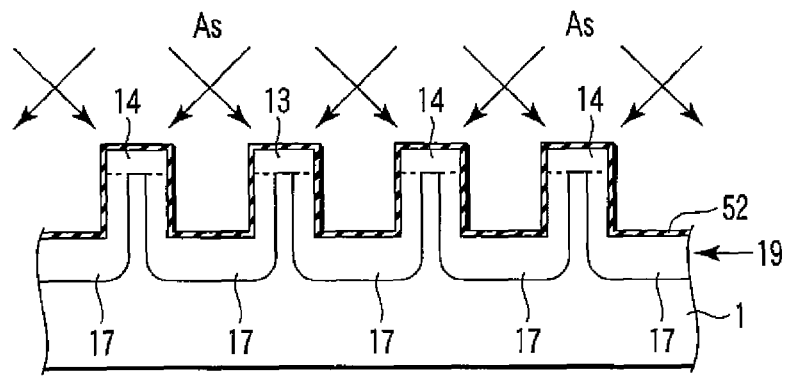

Then, a photoresist is coated on the substrate surface and patterned so as to form openings on the source area side along the row direction as shown in FIGS. 10A to 10C to form a photoresist mask 54. As ions are then obliquely implanted in the substrate surface using the photoresist mask 54. The source area 14 is thus formed to be thicker than the drain area 16 in a substrate depth direction. This arrangement is used to reduce the resistance of the source line 19, formed by connecting the source areas 14 arranged in the same row direction, via the diffusion layer 17, as shown particularly in FIG. 10C. Then, to activate impurities introduced into the substrate, a thermal treatment is performed by the rapid thermal annealing (RTA) process.

Figure 11A:
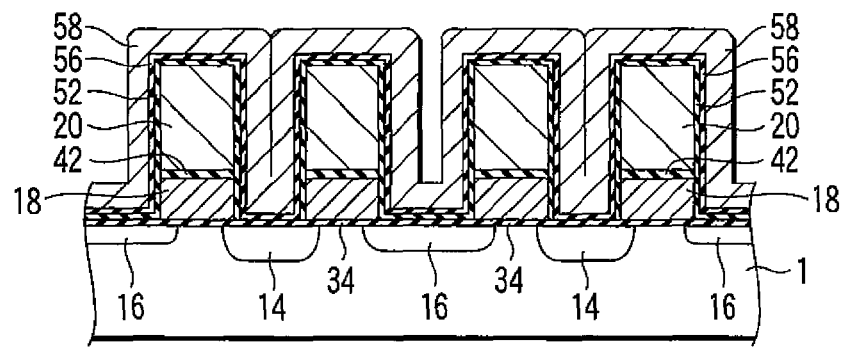
FIGS. 11A to 11C are sectional views which show a ninth step of fabricating the NOR-type nonvolatile semiconductor memory device shown in FIG. 1 and which correspond to directions along lines A-A, B-B, and C-C in FIG. 1.
Figure 11B:
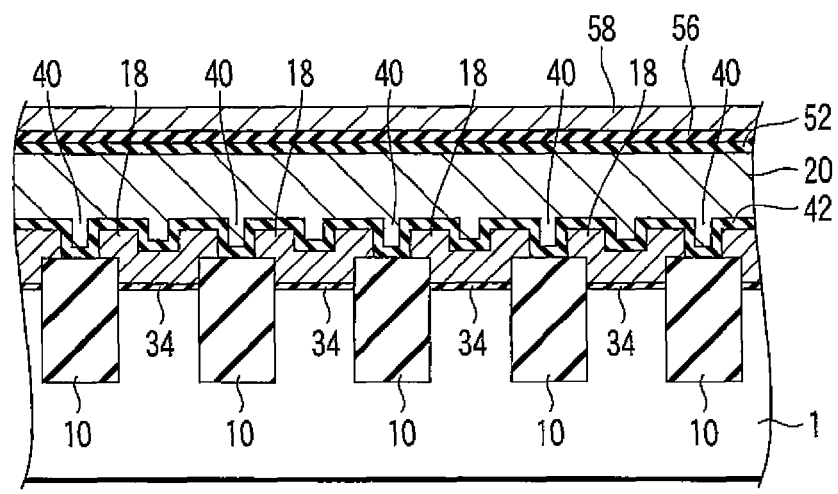
Figure 11C:
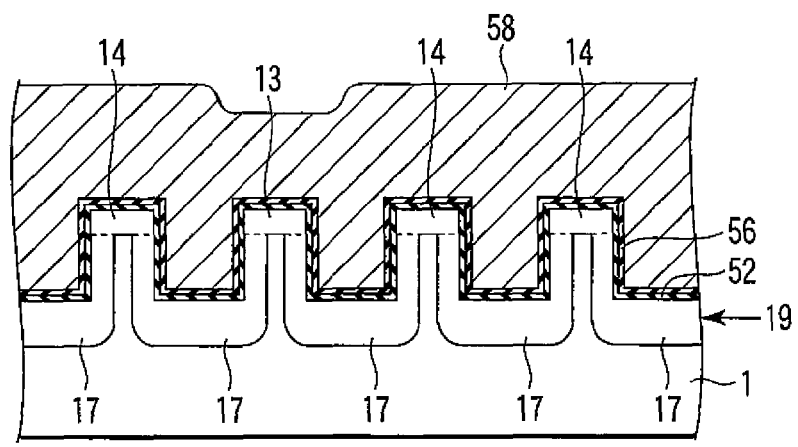

Then, as shown in FIGS. 11A to 11C, a TEOS-containing oxide film 56 and a polysilicon 58 are sequentially deposited on the substrate surface; in the subsequent step, the TEOS-containing oxide film 56 is used as a stopper for processing a polysilicon spacer, and the polysilicon 58 is used as a polysilicon spacer. This enables an oxide film formed between the shield polysilicon wire and the floating gate 18 in the subsequent step to be made thicker than the tunnel oxide film. This in turn enables a reduction in electric fields applied to between the floating gate and the shield polysilicon wire during data erasure. As a result, the dielectric breakdown of the oxide film can be inhibited.

Here, the film thickness of the polysilicon 58 is set to be at least half the width between the floating gates adjacent to each other via the source area. This enables the polysilicon to be completely buried in the opening on the source area.

As shown in the plan view in FIG. 1, the area in which the source contact 28 is formed is greater than the area in which the source area 14 is formed, in the width along the column direction. Accordingly, as shown in FIG. 11C, the film thickness of the polysilicon 58 is smaller in the area in which the source contact 28 is formed than in the other areas.

Figure 12A:
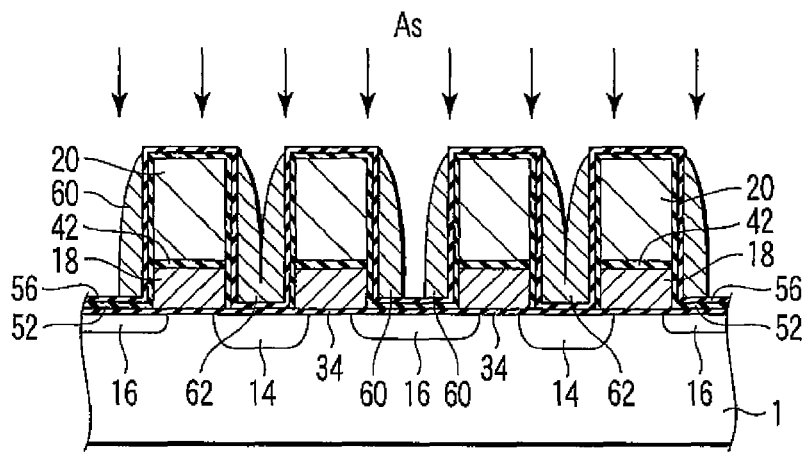
FIGS. 12A to 12C are sectional views which show a tenth step of fabricating the NOR-type nonvolatile semiconductor memory device shown in FIG. 1 and which correspond to directions along lines A-A, B-B, and C-C in FIG. 1.
Figure 12B:
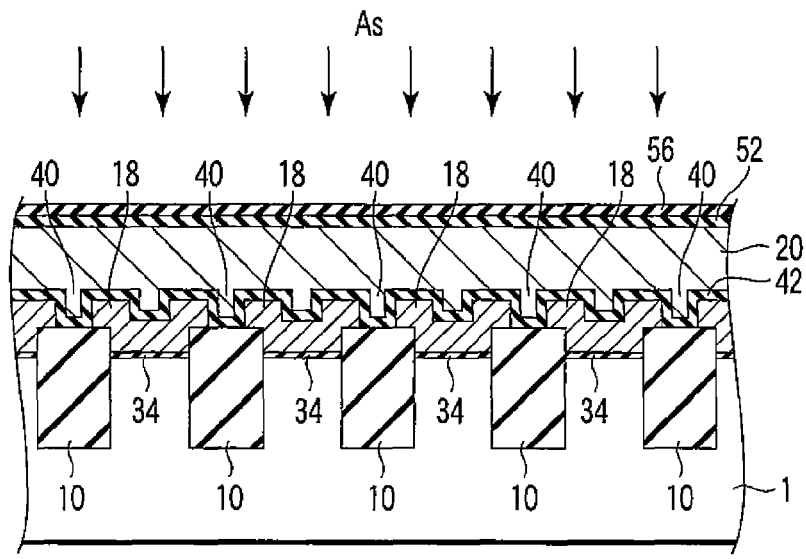
Figure 12C:
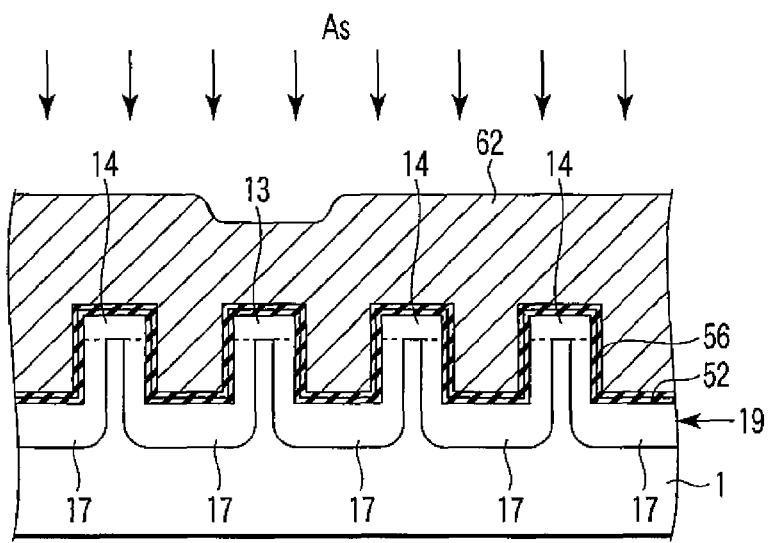

Then, as shown in FIGS. 12A to 12C, the polysilicon 58 is etched back to form polysilicon spacers 60 on the drain area side. On the source area side, the space between the memory cells adjacent to each other in the column direction is smaller than on the drain area side, so that the polysilicon 62 maintains its as-buried shape. Then, to make conductive the polysilicon 62, which is used as a shield wire in the subsequent step, or to reduce the resistance of the contact portion of the drain area 16 and the control gate, which forms the word line, As ions are additionally implanted in the substrate surface.

Figure 13A:
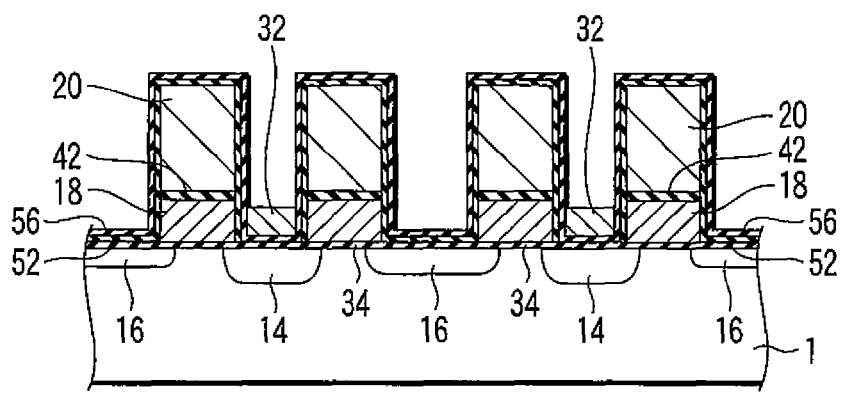
FIGS. 13A to 13C are sectional views which show an eleventh step of fabricating the NOR-type nonvolatile semiconductor memory device shown in FIG. 1 and which correspond to directions along lines A-A, B-B, and C-C in FIG. 1.
Figure 13B:
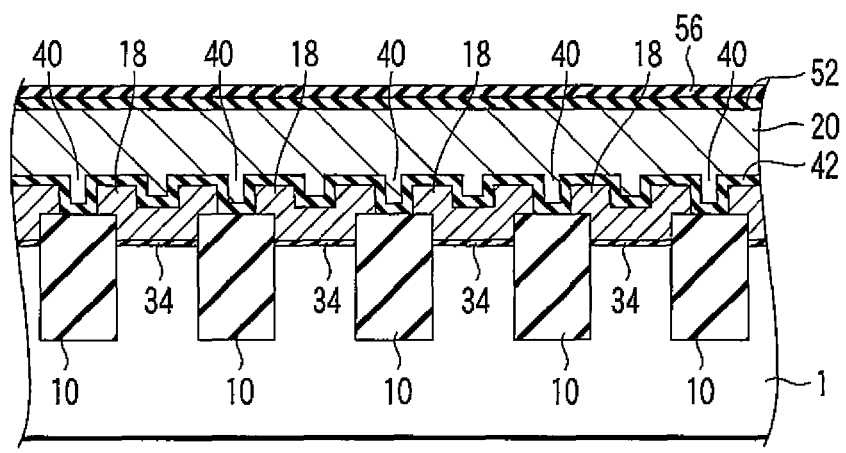
Figure 13C:
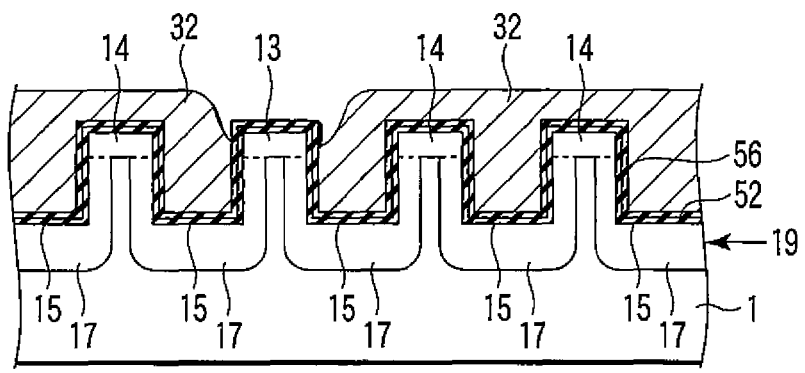

Then, as shown in FIGS. 13A to 13C, the polysilicon is isotropicllay etched by the chemical dry etching (CDE) process to completely remove the drain area-side polysilicon spacers 60. In this case, on the source area side, the opening is narrowed so that the polysilicon 62 remains buried in the opening. Thus, even after the drain area-side polysilicon 60 is completely removed, the polysilicon 32 can be left on the source area side. This polysilicon 32 is used as the shield polysilicon wire 32.

Figure 14A:
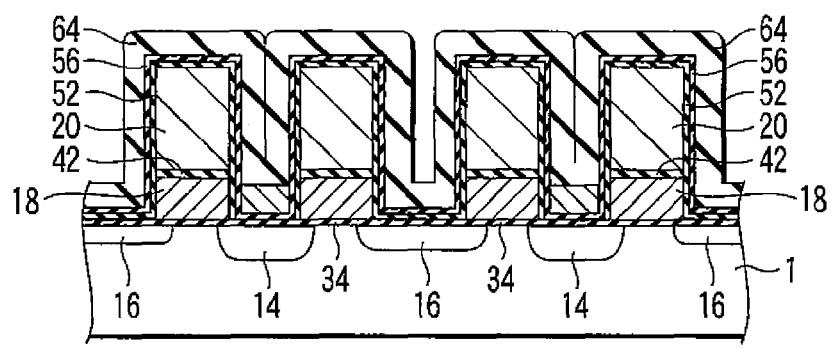
FIGS. 14A to 14C are sectional views which show a twelfth step of fabricating the NOR-type nonvolatile semiconductor memory device shown in FIG. 1 and which correspond to directions along lines A-A, B-B, and C-C in FIG. 1.
Figure 14B:
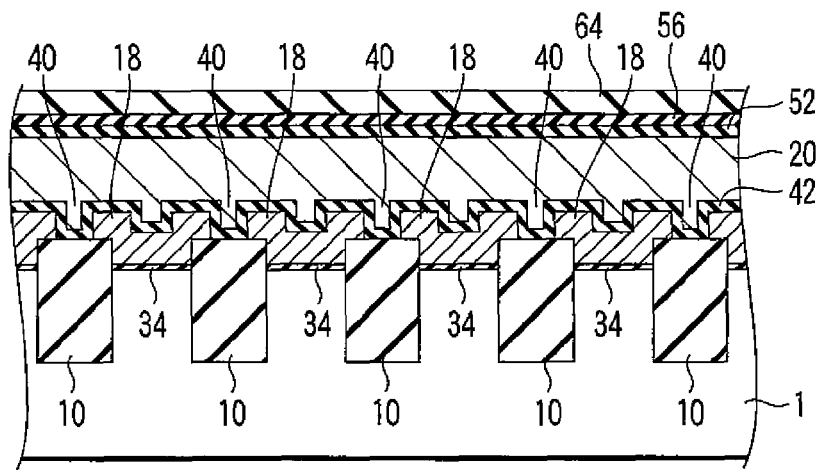
Figure 14C:
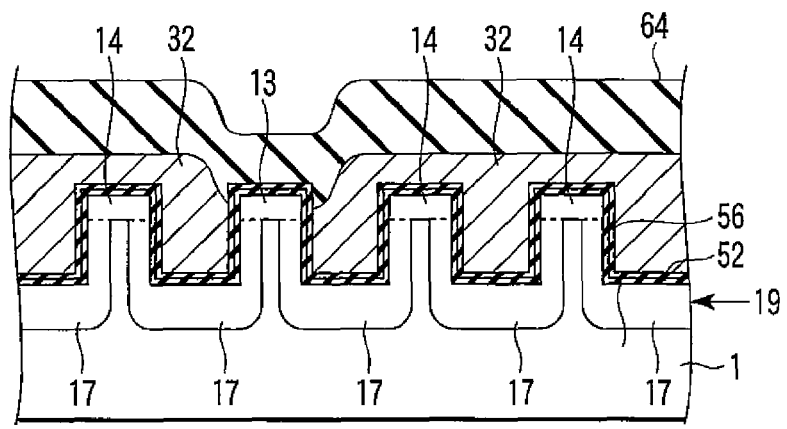

Then, as shown in FIGS. 14A to 14C, a silicon nitride film 64 functioning as a silicon nitride film spacer for a gate sidewall is deposited on the substrate surface by, for example, the CVD process.

Figure 15A:
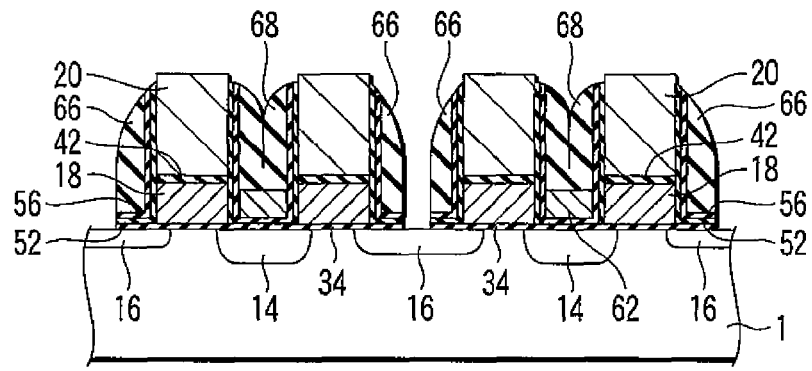
FIGS. 15A to 15C are sectional views which show a thirteenth step of fabricating the NOR-type nonvolatile semiconductor memory device shown in FIG. 1 and which correspond to directions along lines A-A, B-B, and C-C in FIG. 1.
Figure 15B:
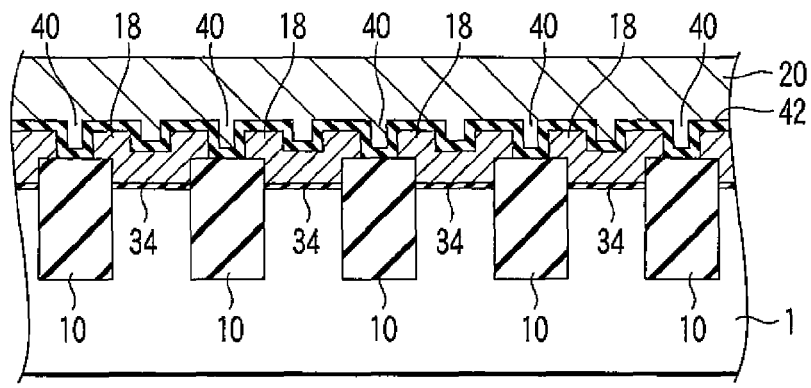
Figure 15C:
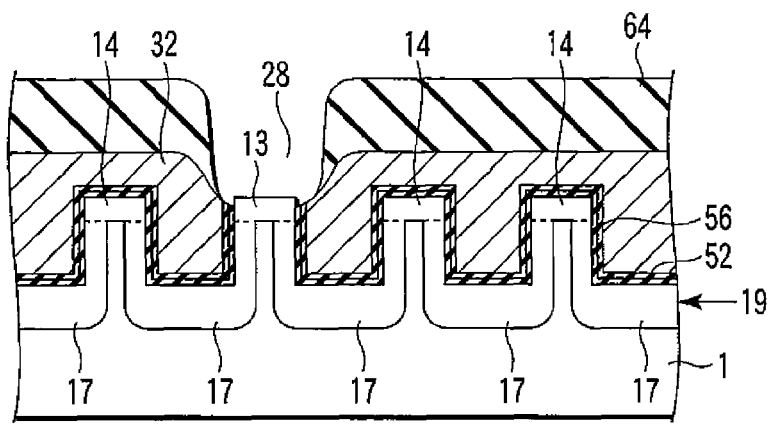

Then, as shown in FIGS. 15A to 15C, the silicon nitride film 64 is etched back to form a silicon nitride film spacer 66 on a gate sidewall on the drain area 16 side. At the same time, the films 64, 56, 52, 34 are etched so as to expose the surface of the polysilicon 20 and the drain area 16. Here, as shown in FIG. 15A, the space, on the source area 14 side, between the memory cells adjacent to each other in the column direction is intentionally narrowed. Accordingly, silicon nitride film spacers 68 remain buried in the spaces.

Figure 16A:
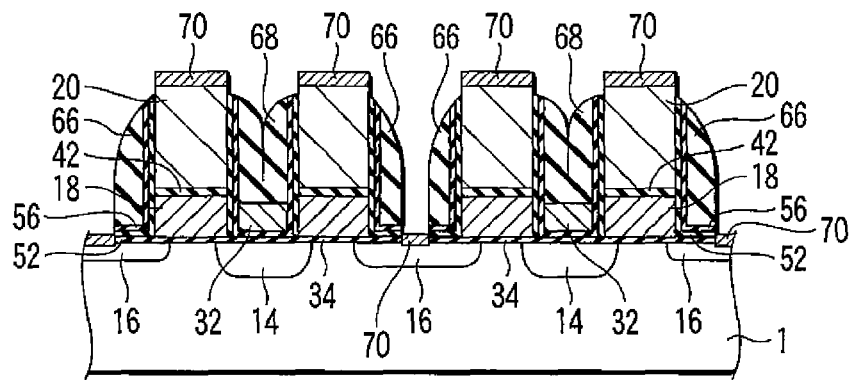
FIGS. 16A to 16C are sectional views which show a fourteenth step of fabricating the NOR-type nonvolatile semiconductor memory device shown in FIG. 1 and which correspond to directions along lines A-A, B-B, and C-C in FIG. 1.
Figure 16B:
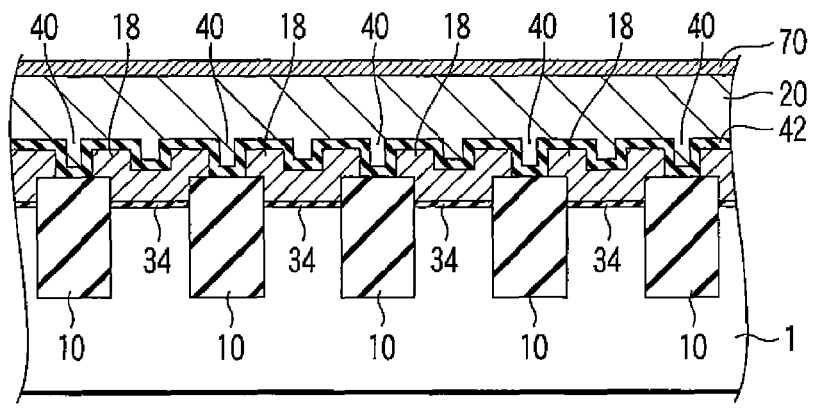
Figure 16C:
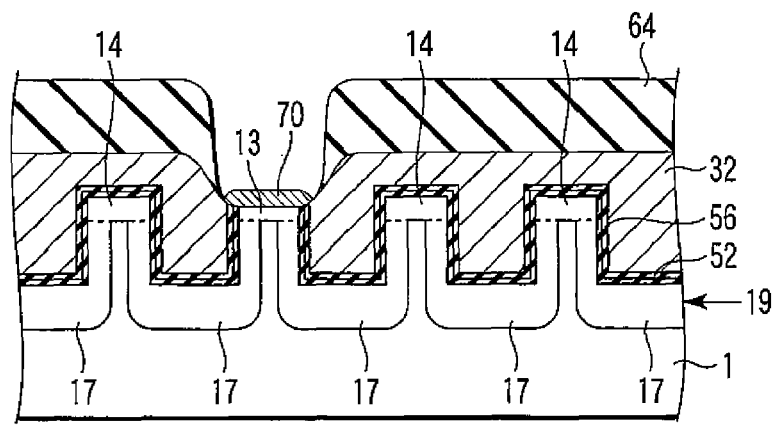

Then, as shown in FIGS. 16A to 16C, for example, NiSi 70 is selectively formed on the word lines 20 and drain areas 16 by a salicide forming process. At this time, as shown in FIG. 16C, NiSi 70 is formed so that the common source area 13 and the shield polysilicon wire 32 are electrically connected together on the common source area 13. NiSi 70 provided on the common source area 13 is an example of a conductive member 82.

Figure 17A:
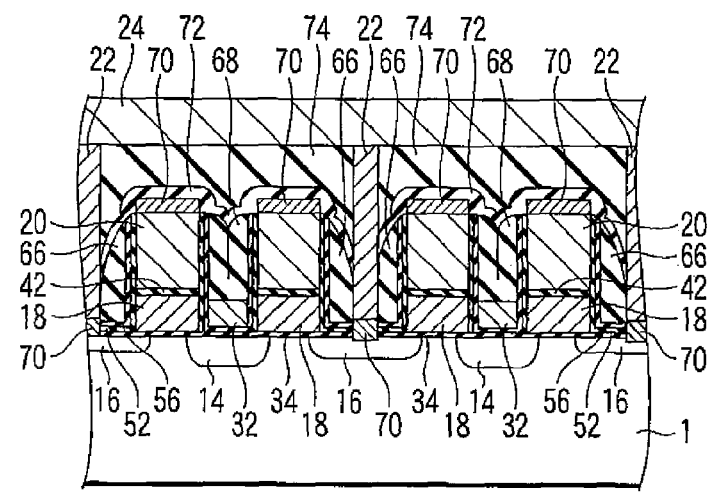
FIGS. 17A to 17C are sectional views which show a fifteenth step of fabricating the NOR-type nonvolatile semiconductor memory device shown in FIG. 1 and which correspond to directions along lines A-A, B-B, and C-C in FIG. 1.
Figure 17B:
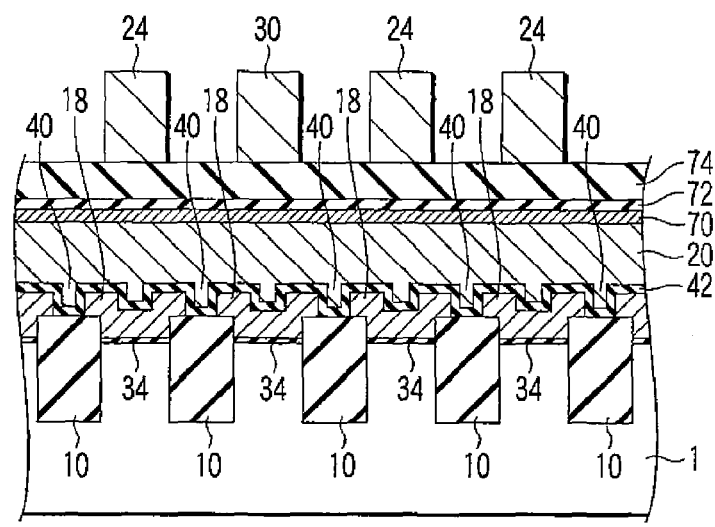
Figure 17C:
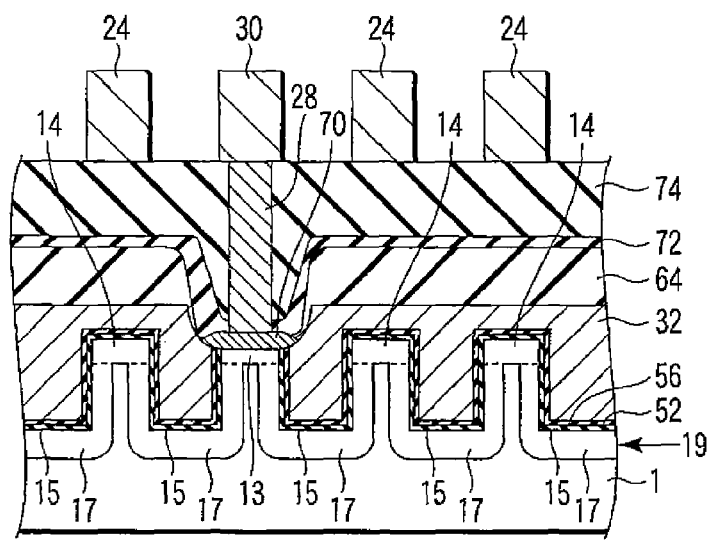

Then, as shown in FIGS. 17A to 17C, a barrier silicon nitride film 72 and an interlayer insulating film 74 are sequentially formed. The substrate surface is subsequently flattened. Drain contact portions are then formed and metal is buried in the drain contact portions to form drain contacts 22. Bit lines 24 are subsequently formed on the substrate surface in the column direction so as to connect to the contacts 22. At the same time, a source contact portion is then formed and metal is buried in the source contact portion to form a source contact 28. A metal source line 30 is subsequently formed on the substrate surface in the column direction so as to connect to the contact 28 and to extend parallel to the bit lines 24. Here, a conductive drain contact is provided between the floating gates adjacent to each other in the column direction via the drain area 16. As a result, the shield effect of the drain contact itself enables a sharp reduction in the capacitive coupling between the floating gates.

Then, an overlying wiring layer (not shown) and an overlying passivation layer (not shown) are sequentially formed. Ultraviolet irradiation is subsequently performed on the floating gates and shield polysilicon wires, which are in electrically floating state, to release the stored charges to the substrate. This ends the process of manufacturing a NOR-type nonvolatile semiconductor memory device.

In the NOR-type nonvolatile semiconductor memory device configured as described above, the shield polysilicon wire is formed on and along the source line, enabling a reduction particularly in the capacitive coupling between the floating gates lying opposite each other across the source line. This makes it possible to inhibit a variation in threshold voltage, which poses a problem with memory size reduction.

Further, for the trenches 15 arranged on the source area side in the same row direction, the shield polysilicon is buried even in portions of the trenches 15 from which the buried silicon oxide film has been removed. As a result, in the present embodiment, the volume of the shield polysilicon wire per a set of two floating gates adjacent to each other in the column direction via the source line is greater than in the case of the conventional technique disclosed in, for example, Jpn. Pat. Appln. KOKAKI Publication No. 2003-188287. This enables the resistance of the shield polysilicon wire to be sufficiently reduced. Thus, the shield effect of the shield polysilicon wire makes it possible to further reduce the capacitive coupling between the floating gates and to inhibit a variation in the threshold voltage for the memory cell transistors.

Further, the shield polysilicon wire 32 electrically connected to the source line 19 to fix the potential further enhances the shield effect of the polysilicon wire 32.

During data erasure, a high voltage is applied to between the shield polysilicon wire 32 and the word line 20. This causes the insulating film provided between the word line 20 and the shield polysilicon wire 32 to be readily dielectrically broken down. In the present embodiment, the top surface of the shield polysilicon wire 32 is lower than that of the floating gate 18 so as to increase the distance between the polysilicon wire 32 and the word line 20. More specifically, the closest distance between the word line 20 and the shield polysilicon wire 32 is desirably equal to or greater than the sum of the thickness of the ONO film 42 and the thickness of the tunnel oxide film 34. In other words, the top surface of the shield polysilicon wire 32 is desirably lower than that of the floating gate 18 by the value of thickness of the tunnel oxide film. This enables a reduction in electric fields applied to the insulating film provided between the word line 20 and the shield polysilicon wire 32, allowing the dielectric breakdown of the oxide film to be inhibited.

Description will now be given of a nonvolatile semiconductor memory device according to a second embodiment of the present invention. The present embodiment relates to the structure of the nonvolatile semiconductor memory device described in the first embodiment in detail and in which the shield polysilicon wire is not electrically connected to the source line but is floating, as well as a method for fabricating this nonvolatile semiconductor memory device.

Figure 18:
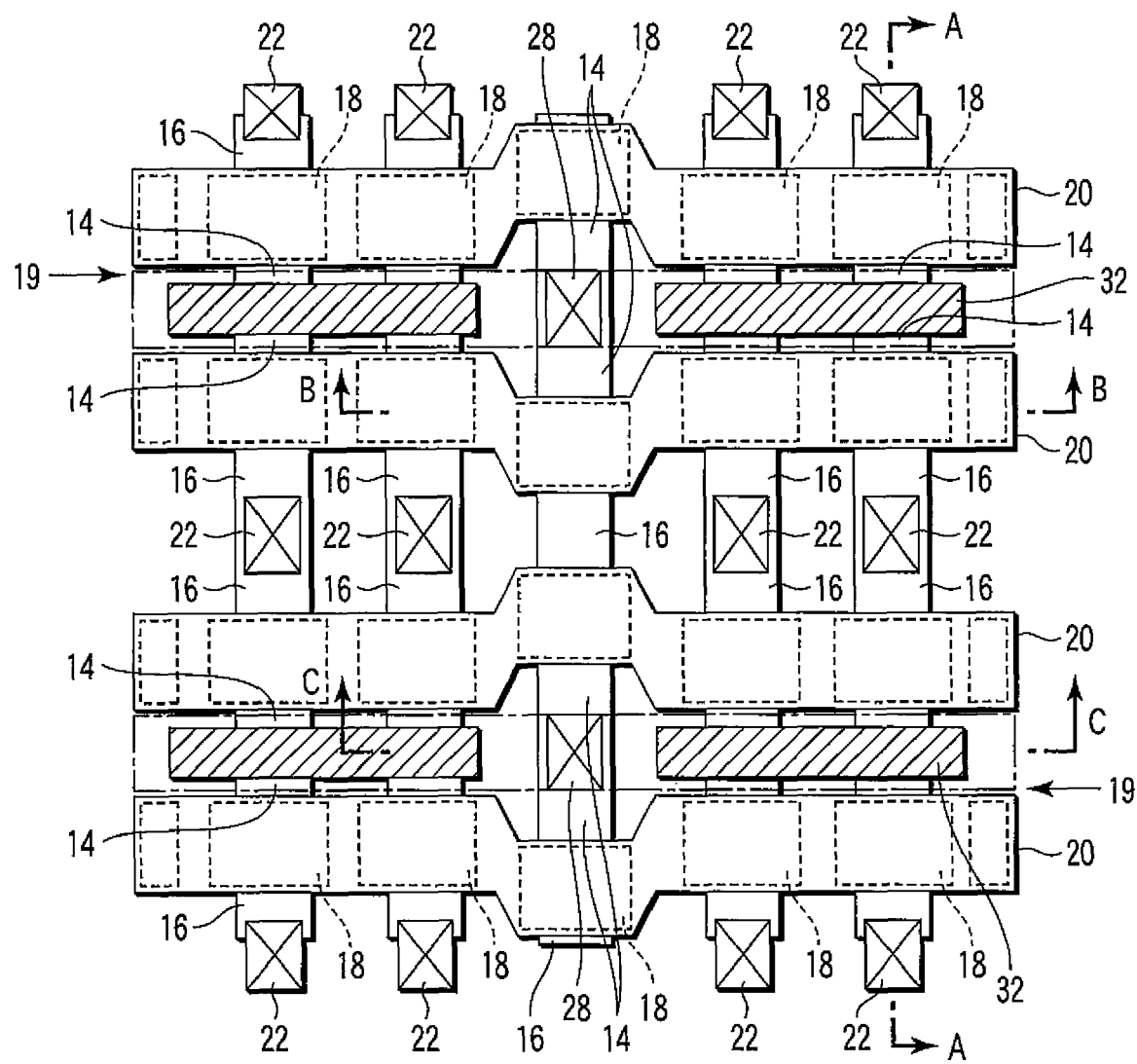
FIG. 18 is a plan view showing a memory cell array comprising a NOR-type nonvolatile semiconductor memory device according to a second embodiment of the present invention.
Figure 19:
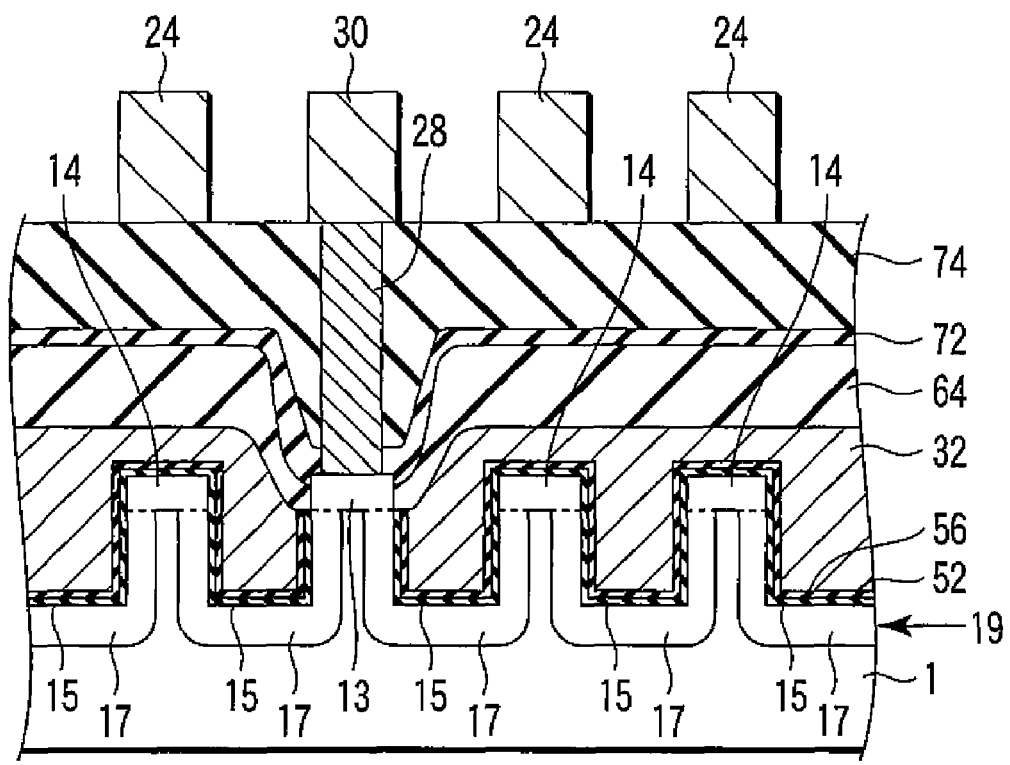
FIG. 19 is a sectional view taken along line C-C in the memory cell array shown in FIG. 18.
Figure 20:
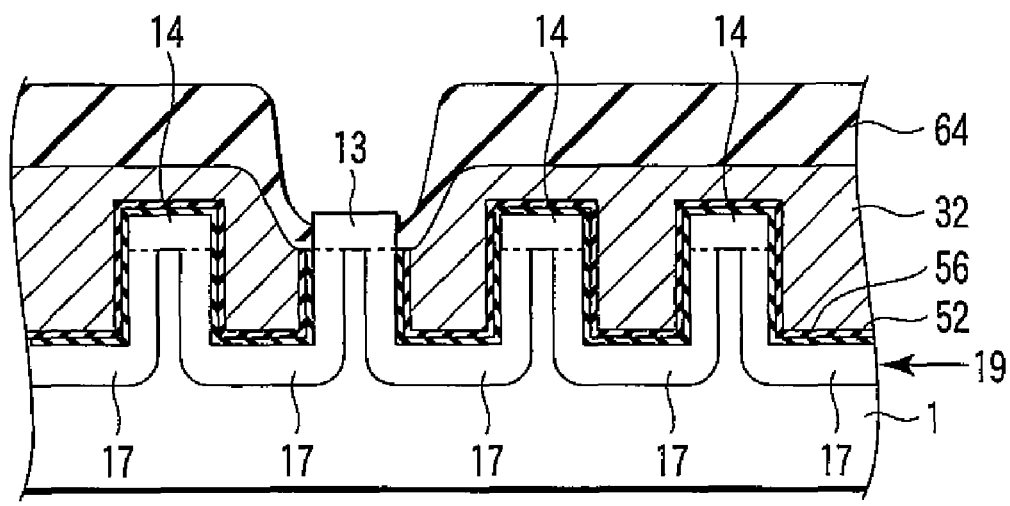
FIG. 20 is a sectional view which shows a first step of fabricating the NOR-type nonvolatile semiconductor memory device shown in FIG. 18 and which corresponds to a direction along line C-C in FIG. 18.
Figure 21:
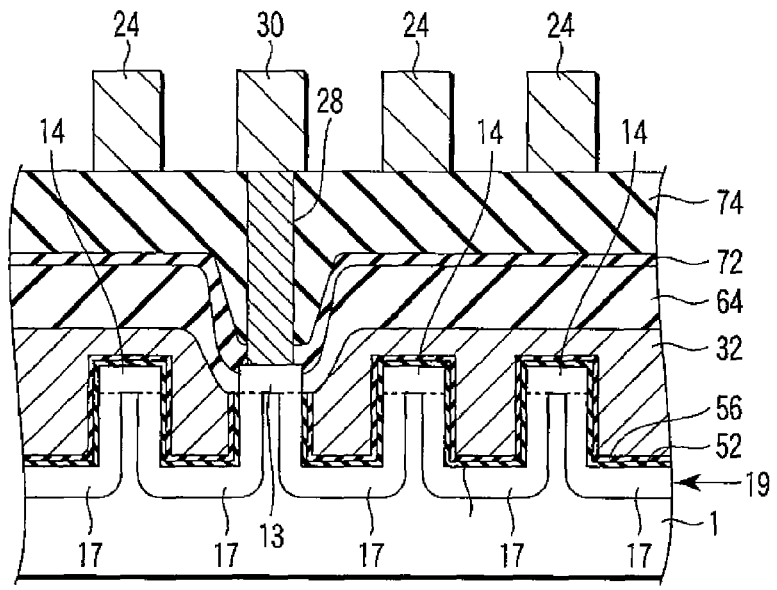
FIG. 21 is a sectional view which shows a second step of fabricating the NOR-type nonvolatile semiconductor memory device shown in FIG. 18 and which corresponds to a direction along line C-C in FIG. 18.

The present embodiment will be described below in conjunction with the structure and fabricating method, with reference to FIGS. 18 to 21. FIG. 18 is a plan view of a memory cell array of the nonvolatile semiconductor memory device according to the present embodiment. FIGS. 19 to 21 are sectional views and process diagrams of the memory cell array in FIG. 18 taken along line C-C. In the diagrams of the second embodiment, the same components as those shown in FIGS. 1 to 17, used to describe the semiconductor memory device and fabricating method according to the first embodiment, are denoted by the same reference numerals.

As shown in FIG. 19, the sectional structure along line C-C is similar to that in the first embodiment except that the shield polysilicon wire 32 is not electrically connected to the source line 19. The description of the sectional structure along line C-C is thus omitted. The sectional structures along lines A-A and B-B in FIG. 18 are also similar to those in the first embodiment.

Also for the fabricating method, the process diagrams of cross sections along lines A-A and B-B are also similar those of cross sections of the memory cell array in FIG. 1 taken along lines A-A and B-B. Also for the process diagrams of the cross section along line C-C, a part of the process which ends with the step of depositing a silicon nitride film as shown in FIG. 14C is similar to that in the first embodiment. Accordingly, the description of these process diagrams is omitted.

After the step in FIG. 14C, as shown in FIG. 20, an area of the silicon nitride film 64 in which a source contact is to be formed is removed so as to exposed the common source area 13, which is to be connected to the metal source line in the subsequent step. In this case, in contrast to FIG. 15C for the first embodiment, the processing is executed so as not to expose the surface of the polysilicon wire 32.

Then, as is the case with the step shown in FIG. 17 for the first embodiment, as shown in FIG. 21, a barrier silicon nitride film 72 and an interlayer insulating film 74 are formed, and the substrate surface is then flattened. Then, an opening is formed in an area in which a source contact is to be formed, and metal is buried in the opening to form a source contact 28. A metal source line 30 is subsequently formed so as to electrically connect to the contact 28 and to extend on the interlayer insulating film parallel to the bit lines 24. The subsequent steps are similar to those in the first embodiment and thus will not be described.

As described above, in the NOR-type nonvolatile semiconductor memory device according to the present embodiment, the shield polysilicon wire 32 is located so as not to electrically connect to the common source area 13 or source contact 28. In this case, the shield polysilicon wire 32 is electrically floating. However, a strong capacitive coupling occurs between the floating shield polysilicon wire 32 and the source line 19. Consequently, the potential of the polysilicon wire 32 varies very slightly with respect to the source line 19. That is, even if the potential of the shield polysilicon wire 32 is not fixed, the shield polysilicon wire 32 has a predetermined potential for the source line. The shield effect of the shield polysilicon wire 32 thus makes it possible to inhibit an increase in the magnitude of the capacitive coupling between the adjacent floating gates.

Further, as is the case with the first embodiment, for the element isolation regions arranged on the source area side in the same row direction, the shield polysilicon wire is buried even in portions of the element isolation regions from which the buried silicon oxide film has been removed. As a result, in the present embodiment, the volume of the shield polysilicon wire per a set of two floating gates adjacent to each other in the column direction via the source line is greater than in the case of the conventional technique disclosed in, for example, Jpn. Pat. Appln. KOKAKI Publication No. 2003-188287. This enables the resistance of the shield polysilicon wire to be sufficiently reduced. Thus, the shield effect of the shield polysilicon wire makes it possible to further reduce the capacitive coupling between the floating gates and to inhibit a variation in the threshold voltage for the memory cell transistors.

Now, description will be given of a nonvolatile semiconductor memory device according to a third embodiment of the present invention. The present embodiment relates to a sectional structure in which the polysilicon spacers and silicon nitride film spacers used in the step for the memory cell portion in the first or second embodiment are used to form a lightly doped drain (LDD) area of a transistor (hereinafter referred to as a peripheral transistor) in a peripheral circuit portion, as well as a method for fabricating this sectional structure. In the description below, by way of example, two types of N-type MOS transistors (hereinafter sometimes referred to as NMOS1 and NMOS2) with different LDD spacer widths are provided in the peripheral circuit portion.

Figure 22:
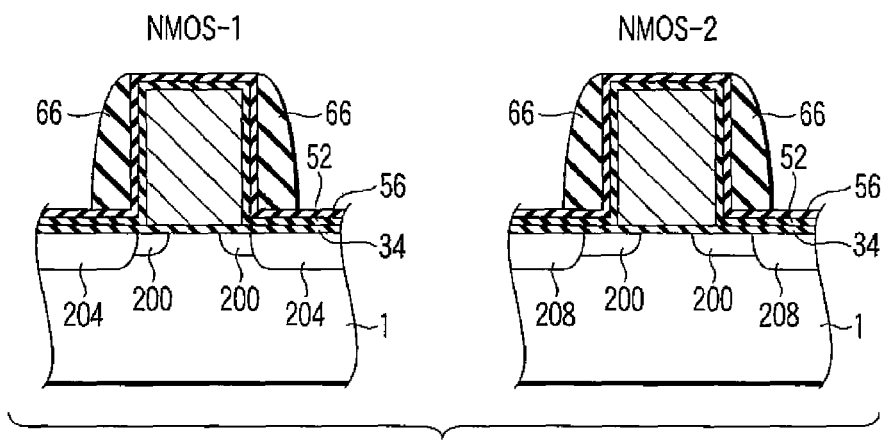
FIG. 22 is a sectional view of a peripheral transistor according to a third embodiment of the present invention.

With reference to FIGS. 22 to 27, description will be given of the sectional structure of the MOS transistor and the method for fabricating this MOS transistor, according to the present embodiment. FIG. 22 is a sectional view showing the structure of the peripheral transistor according to the present embodiment. FIGS. 23 to 27 show sectional step diagrams of the peripheral transistor in FIG. 22. In the figures of the present embodiment, the same components as those shown in FIGS. 1 to 17, used to describe the semiconductor memory device and fabricating method according to the first embodiment, are denoted by the same reference numerals.

First, the structure of the memory cell portion and the method for fabricating the memory cell portion are similar to those in the first or second embodiment and will not be described below. Also for the method for manufacturing the peripheral transistor, a part of the method which ends with the step of depositing a TEOS-containing oxide film and a polysilicon as shown in FIGS. 11A to 11C is similar to that in the first embodiment. Accordingly, the description of this process is omitted.

Figure 23:
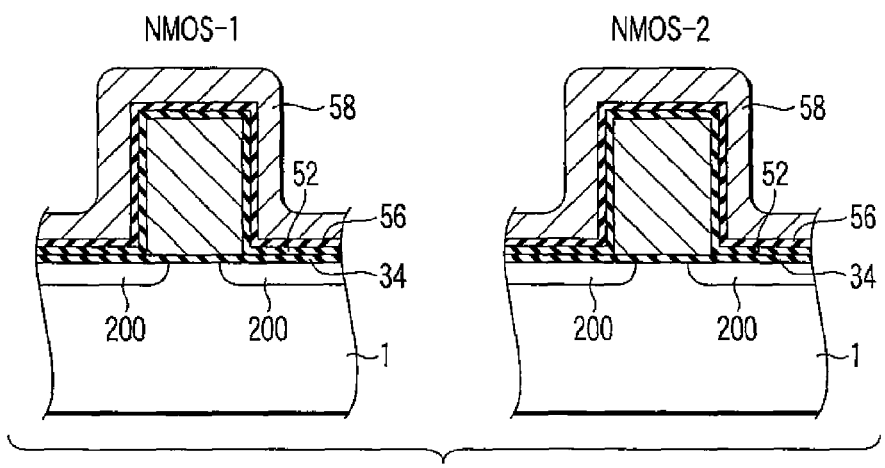
FIG. 23 is a sectional view showing a first step of fabricating the peripheral transistor shown in FIG. 2.

As shown in FIG. 23, as is the case with the step for the memory cell portion in FIG. 11A, an N-type diffusion area 200 functioning as the LDD area of the peripheral transistor is formed. A polysilicon 58 functioning as a polysilicon spacer is then deposited.

Then, as shown in FIG. 24, as is the case with the step for the memory cell portion in FIG. 12, the polysilicon 58 is etched back to form a polysilicon spacer 60 on a gate side wall of the peripheral transistor.

Then, as shown in FIG. 25, a patterned photoresist mask 202 is formed on the NMOS2 side. As ions are subsequently implanted using the photoresist mask 202 to selectively form high-concentration diffusion areas 204 on the NMOS1 side. Then, to activate impurities introduced into the semiconductor substrate 1, a thermal treatment is performed by the RTA process. The additional implantation of As ions in the memory cell portion as described above enables high-concentration diffusion areas 204 to be formed without adding any new step to the peripheral transistor.

Now, with reference to FIGS. 26 and 27, description will be given of a step of forming an LDD area with a different spacer width in a peripheral transistor different from that shown in FIG. 25. As shown in FIG. 26, as is the case with the step for the memory cell portion in FIG. 14, a silicon nitride film 64 functioning as a silicon nitride spacer on the gate side wall is deposited on the substrate surface by, for example, the CVD process.

Figure 27:
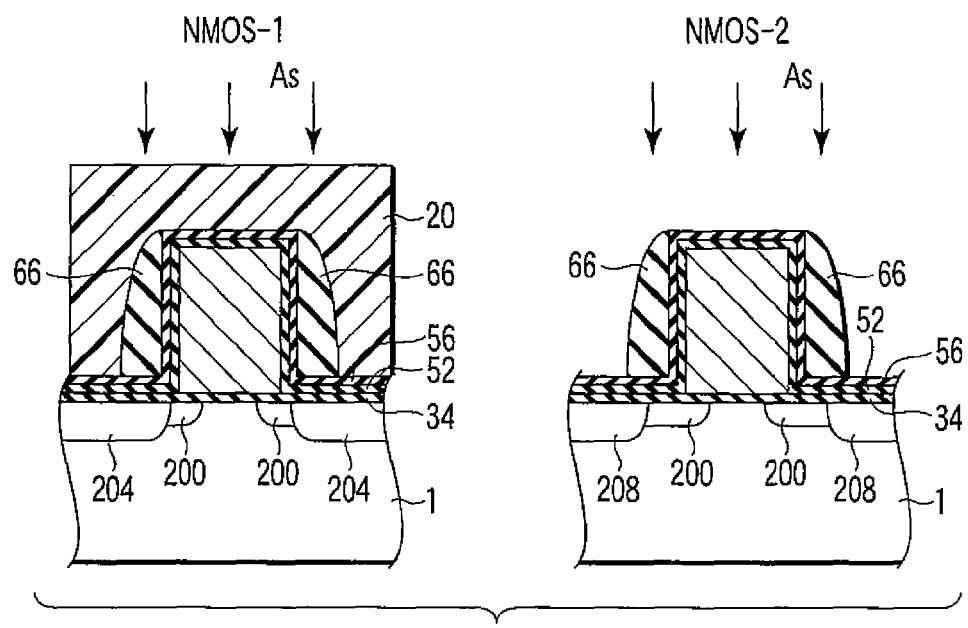
FIG. 27 is a sectional view showing a fifth step of fabricating the peripheral transistor shown in FIG. 2.

Then, as shown in FIG. 27, as is the case with the step for the memory cell portion in FIG. 15, the silicon nitride film 64 is etched back to form a silicon nitride film spacer 66 on the gate side wall of the peripheral circuit portion transistor.

Then, a patterned photoresist mask 206 is formed on the NMOS1 side. As ions are implanted using the photoresist mask 206 to selectively form high-concentration diffusion areas 208 on the NMOS2 side. In this case, setting the thickness of the silicon nitride film 64 different from that of the polysilicon 58 in FIG. 11 enables two different LDD spacer widths to be introduced into the peripheral transistor according to the product specifications without the need to add any new step. That is, the spacer 66 is wider than the spacer 60, shown in FIG. 25. It is thus possible to make the LDD length (width of the diffusion layer 200) of NMOS2 greater than that of NMOS1.

The NOR-type nonvolatile semiconductor memory device according to the present embodiment exerts the effects of the first or second embodiment. In addition to these effects, the present embodiment produces the following effect. By setting the thickness of the silicon nitride film, functioning as the silicon nitride film spacer, different from that of the polysilicon, functioning as the polysilicon spacer, it is possible to introduce the two LDD spacer widths into the transistors in the peripheral circuit portion according to the product specifications.

The embodiments of the present invention are not limited to the first to third embodiments, described above. Various modifications may be made to the first to third embodiments. For example, in the above embodiments, the impurity-doped polysilicon is used as the shield polysilicon wire. However, the present embodiment is not limited to this. The shield polysilicon wire may be formed of a metal film such as Al or Cu, a polycide film, a tungsten silicide (WSi) film, or the like.

Further, in the above embodiments, NiSi is used for the salicide technique. Instead, cobalt silicide (CoSi), titanium silicide (TiSi), or the like may be used.

Furthermore, in the arrangement of the floating gates on the plan view, the rows and the columns may be interchanged.

That is, the nonvolatile semiconductor memory device according to the first to third embodiments comprises:

floating gates arranged on a semiconductor substrate in a matrix;

source areas formed in a surface of the semiconductor substrate and each of which is shared by the floating gates adjacent to each other in a column direction;

drain areas formed in the surface of the semiconductor substrate and each of which face the source area in the column direction with the floating gate interposed therebetween, the drain area being wider than the source area in the column direction;

word lines each of which is continuously formed on the floating gates arranged in the same row direction;

bit lines each of which is electrically connected to the drain area via a drain contact and provided on the word lines in the column direction with an interlayer insulating film interposed therebetween;

diffusion layers each of which is formed on an inner wall portion of a trench made between the source areas adjacent to each other in the same row direction and electrically connects the adjacent source areas together;

source lines each of which is formed of the source area and diffusion layer on the same row; and shield wires each of which is disposed on and along the source line, a top surface of the shield wire being lower than that of the floating gate adjacent to the shield wire.

Figure 28:
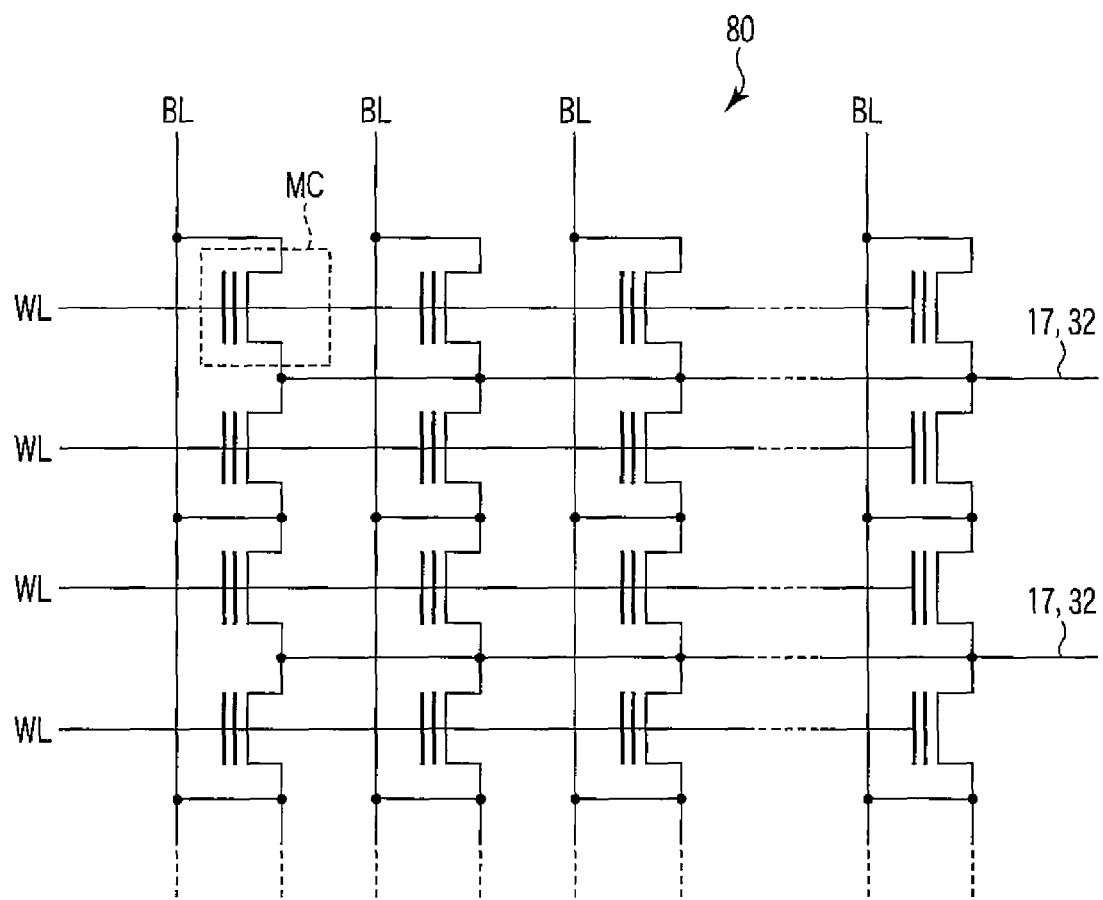
FIG. 28 is a circuit diagram of a memory cell array comprising a NOR-type nonvolatile semiconductor memory device according to the first to third embodiments of the present invention.

As shown in the circuit diagram of the memory cell array of the semiconductor memory according to the above embodiment in FIG. 28, the above configuration can also be described as follows.

The nonvolatile semiconductor memory device includes:

memory cells MC each including a charge accumulation layer and a control gate formed on the charge accumulation with an inter-gate insulating film interposed therebetween;

a memory cell array 80 including the memory cells MC arranged in a matrix on a semiconductor substrate, the memory cells MC adjacent to each other in a column direction of the memory cell array 80 sharing a source or a drain;

word lines WL each connecting commonly the control gates of the memory cells MC in a same row of the memory cell array 80;

bit lines BL each connecting commonly drains of the memory cells MC in the same column of the memory cell array 80;

diffusion layers 17 each formed in a surface of the semiconductor substrate located between the sources adjacent to each other in a row direction of the memory cell array 80 to electrically connect the sources adjacent to each other in the row direction together, a surface of an area of the semiconductor substrate in which the diffusion layer 17 is formed being lower than a surface of an area of the semiconductor substrate in which the sources are formed; and shield wires 32 each formed on the source and the diffusion layer 17, a top surface of the shield wire 32 being lower than that of the charge accumulation layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:

floating gates arranged on a semiconductor substrate in a matrix;

source areas formed in a surface of the semiconductor substrate and each of which is shared by the floating gates adjacent to each other in a column direction;

drain areas formed in the surface of the semiconductor substrate and each of which face the source area in the column direction with the floating gate interposed therebetween, the drain area being wider than the source area in the column direction;

word lines each of which is continuously formed on the floating gates arranged in a row direction and within the same row;

bit lines each of which is electrically connected to the drain area via a drain contact and provided above the word lines in the column direction with an interlayer insulating film interposed therebetween;

diffusion layers each of which is formed on an inner wall portion of a trench made between the source areas adjacent to each other in the row direction within the same row and electrically connects the adjacent source areas together;

source lines each of which is formed of the source areas and diffusion layers on the same row;

an insulating layer which is formed on the diffusion layers and the source areas except for one of the source areas; and shield wires each of which is disposed on the insulating layer and along the source line, a top surface of the shield wire being lower than a top surface of the floating gate adjacent to the shield wire, the insulating layer being interposed between the source line and the shield wire, the shield wires being isolated from the source lines by the insulating layer except for one of the source areas.

2. The device according to claim 1, further comprising a conductive member which is formed on the one of the source areas and electrically connects the shield wire to the source line; and metal source line which is intermittently electrically connected to both the source lines and the shield wires via the conductive member in the column direction and located parallel to the bit lines.

3. The device according to claim 1, wherein a material forming the shield wire includes conductive polysilicon.

4. The device according to claim 1, further comprising:

a first gate insulating film formed between the semiconductor substrate and the floating gates; and a second gate insulating film formed between the floating gates and the word lines, wherein the closest distance between the word line and the shield wire is equal to or greater than the sum of the thickness of the first gate insulating film and the thickness of the second gate insulating film.

5. The device according to claim 1, further comprising:

a gate insulating film formed between the semiconductor substrate and the floating gates, wherein the top surface of the shield wire is located lower than that of the floating gate by at least the value of the thickness of the gate insulating film.

6. The device according to claim 1, wherein at a region between the source areas adjacent to each other in a row direction and within the same row, the shield wire is buried in the trench.

7. The device according to claim 1, wherein the shield wire fills inside of the trench.

8. The device according to claim 1, further comprising
a conductive member which is formed on the one of the source areas and electrically connects the shield wires to the source lines; and
a contact plug formed on the conductive member.

9. A nonvolatile semiconductor memory device comprising:
memory cells each including a charge accumulation layer and a control gate formed on the charge accumulation with an inter-gate insulating film interposed therebetween;
a memory cell array including the memory cells arranged in a matrix on a semiconductor substrate, the memory cells adjacent to each other in a column direction of the memory cell array sharing a source area or a drain area;
word lines each connecting commonly the control gates of the memory cells in a same row of the memory cell array;
bit lines each connecting commonly drain areas of the memory cells in the same column of the memory cell array;
diffusion layers each formed in a surface of the semiconductor substrate located between the source areas adjacent to each other in a row direction of the memory cell array to electrically connect the source areas adjacent to each other in the row direction together, a surface of an area of the semiconductor substrate in which the diffusion layer is formed being lower than a surface of an area of the semiconductor substrate in which the source areas are formed;
an insulating layer which is formed on the diffusion layers and the source areas of the memory cells except for one of the memory cells; and
shield wires each formed on the insulating layer, a top surface of the shield wire being lower than a top surface of the charge accumulation layer,
the insulating layer being interposed between the source areas and the shield wires and between the diffusion layers and the shield wires, the shield wires being isolated from the source areas and the diffusion layers by the insulating layer except for one of the memory cells.

10. The device according to claim 9, wherein a top surface of the shield wires located on the diffusion layer being higher than a surface of the area of the semiconductor substrate in which the areas are formed.

11. The device according to claim 9, further comprising
a conductive member which is formed on the source area of the one of the memory cells and electrically connects the shield wires to the source area of the one of the memory cells; and
a contact plug formed on the conductive member.

12. The device according to claim 9, further comprising
a contact plug which is formed on the source area of the one of the memory cells,
wherein the shield wires are electrically isolated from the source areas of the memory cells.

* * * * *